(12) United States Patent
Scheuerlein

(10) Patent No.: US 7,345,907 B2
(45) Date of Patent: Mar. 18, 2008

(54) APPARATUS AND METHOD FOR READING AN ARRAY OF NONVOLATILE MEMORY CELLS INCLUDING SWITCHABLE RESISTOR MEMORY ELEMENTS

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 156 days.

(21) Appl. No.: 11/179,123

(22) Filed: Jul. 11, 2005

(65) Prior Publication Data

US 2007/0008786 A1    Jan. 11, 2007

(51) Int. Cl.
*G11C 11/00* (2006.01)

(52) U.S. Cl. ............... 365/148; 365/121; 365/100

(58) Field of Classification Search ......... 365/148, 365/121, 100
See application file for complete search history.

(56) References Cited

U.S. PATENT DOCUMENTS

| | | | |
|---|---|---|---|
| 3,761,896 A * | 9/1973 | Davidson ............ 365/148 |
| 5,541,869 A | 7/1996 | Rose et al. |
| 5,915,167 A | 6/1999 | Leedy |
| 6,072,716 A | 6/2000 | Jacobson et al. |
| 6,385,074 B1 | 5/2002 | Johnson et al. |
| 6,473,332 B1 | 10/2002 | Ignatiev et al. |
| 6,545,898 B1 | 4/2003 | Scheuerlein |
| 6,618,295 B2 | 9/2003 | Scheuerlein |
| 6,711,068 B2 * | 3/2004 | Subramanian et al. . 365/189.02 |
| 6,735,104 B2 | 5/2004 | Scheuerlein |
| 6,753,561 B1 | 6/2004 | Rinerson et al. |
| 6,795,340 B2 | 9/2004 | Sakimura et al. |
| 6,831,854 B2 | 12/2004 | Rinerson et al. |
| 6,834,008 B2 | 12/2004 | Rinerson et al. |
| 6,841,833 B2 | 1/2005 | Hsu et al. |
| 6,850,429 B2 | 2/2005 | Rinerson et al. |
| 6,856,536 B2 | 2/2005 | Rinerson et al. |
| 6,856,572 B2 | 2/2005 | Scheuerlein et al. |
| 6,859,382 B2 | 2/2005 | Rinerson et al. |
| 6,859,410 B2 | 2/2005 | Scheuerlein et al. |

(Continued)

OTHER PUBLICATIONS

U.S. Appl. No. 11/179,122, filed Jul. 11, 2005, entitled Nonvolatile Memory Cell Comprising Switchable Resistor and Transistor, by Roy E. Scheuerlein.

(Continued)

*Primary Examiner*—Van Thu Nguyen
*Assistant Examiner*—Nam Nguyen
(74) *Attorney, Agent, or Firm*—Zagorin O'Brien Graham LLP

(57) ABSTRACT

A non-volatile memory cell includes a switch able resistor memory element in series with a switch device. An array of such cells may be programmed using only positive voltages. A method for programming such cells also supports a direct write of both 0 and 1 data states without requirement of a block erase operation, and is scaleable for use with relatively low voltage power supplies. A method for reading such cells reduces read disturb of a selected memory cell by impressing a read bias voltage having a polarity opposite that of a set voltage employed to change the switch able resistor memory element to a low resistance state. Such programming and read methods are well suited for use in a three-dimensional memory array formed on multiple levels above a substrate, particularly those having extremely compact array line drivers on very tight layout pitch.

46 Claims, 15 Drawing Sheets

U.S. PATENT DOCUMENTS

| | | |
|---|---|---|
| 6,879,505 B2 | 4/2005 | Scheuerlein |
| 6,881,623 B2 | 4/2005 | Campbell et al. |
| 6,906,939 B2 | 6/2005 | Rinerson et al. |
| 6,909,632 B2 | 6/2005 | Rinerson et al. |
| 6,917,539 B2 | 7/2005 | Rinerson et al. |
| 6,927,411 B2 | 8/2005 | Kozicki |
| 6,965,137 B2 | 11/2005 | Kinney et al. |
| 7,038,935 B2 | 5/2006 | Rinerson et al. |
| 7,057,922 B2 | 6/2006 | Fukumoto |
| 7,106,618 B2 * | 9/2006 | Morimoto ................... 365/148 |
| 2003/0021148 A1 | 1/2003 | Scheuerlein |
| 2003/0047765 A1 | 3/2003 | Campbell |
| 2004/0100814 A1 | 5/2004 | Hsu |
| 2004/0188714 A1 | 9/2004 | Scheuerlein et al. |
| 2006/0145193 A1 | 7/2006 | So et al. |
| 2006/0146639 A1 | 7/2006 | Fasoli et al. |

OTHER PUBLICATIONS

U.S. Appl. No. 11/179,095, filed Jul. 11, 2005, entitled Memory Cell Comprising a Thin Film Three-Terminal Switching Device Having a Metal Source and/or Drain Region, by Roy E. Scheuerlein and Christopher J. Petti.

U.S. Appl. No. 11/179,077, filed Jul. 11, 2005, entitled Apparatus and Method for Programming an Array of Nonvolatile Memory Cells Including Switchable Resistor Memory Elements, by Roy E. Scheuerlein.

U.S. Appl. No. 11/125,939, filed May 9, 2005, entitled Rewritable Memory Cell Comprising a Diode and a Resistance-Switching Material, by Herner et al.

U.S. Appl. No. 11/143,269, filed Jun. 2, 2005, entitled Rewritable Memory Cell Comprising a Transistor and Resistance-Switching Material in Series, by Petti, et al.

* cited by examiner

APPARATUS AND METHOD FOR READING AN ARRAY OF NONVOLATILE MEMORY CELLS INCLUDING SWITCHABLE RESISTOR MEMORY ELEMENTS

CROSS-REFERENCE TO RELATED APPLICATION(S)

This application is related to the following co-pending U.S. Patent Applications, each filed on even date herewith, and each of which is hereby incorporated by reference in its entirety:

U.S. application Ser. No. 11/179,122 entitled "Nonvolatile Memory Cell Comprising Switch able Resistor and Transistor" by Roy E. Scheuerlein (hereinafter the "Scheuerlein I" application);

U.S. application Ser. No. 11/179,095 entitled "Memory Cell Comprising a Thin Film Three-Terminal Switching Device Having a Metal Source and/or Drain Region" by Roy E. Scheuerlein and Christopher J. Petti (hereinafter the "Scheuerlein II" application); and U.S. application Ser. No. 11/179,077 entitled "Apparatus and Method for Programming an Array of Nonvolatile Memory Cells Including Switch able Resistor Memory Elements" by Roy E. Scheuerlein (hereinafter the "Scheuerlein IV" application).

BACKGROUND OF THE INVENTION

The present invention relates to a nonvolatile memory array, and particularly to an array of nonvolatile memory cells having switch able resistor memory elements.

There are materials that have at least two distinct stable resistivity states. This class of materials can be switched from a high-resistivity state to a low-resistivity state by applying a voltage across the material having a given polarity. To switch the material from the low-resistivity state back to a high-resistivity state, a voltage having the opposite polarity can be applied.

Some of these materials can be switched between resistivity states at relatively low applied voltages, for example two volts or less. These properties would make these materials attractive for use in nonvolatile memory arrays, which retain their memory state even when power is removed from the device. Low-voltage switching is advantageous to reduce power consumption in devices, but many challenges must be overcome to provide the low voltages and reversible voltages required to operate cells incorporating such material, and to avoid accidental programming and/or erase during read.

SUMMARY

In general, and without limiting the invention in any way, the invention is directed to a method for reading a memory array of nonvolatile memory cells having switch able resistor memory elements. Such a method reduces read disturb of a selected memory cell by impressing a read bias voltage having a polarity opposite that of a set voltage employed to change the switch able resistor memory element to a low resistance state. The method provides good performance and allows a larger read bias voltage than otherwise achievable, and is well suited for use in a three-dimensional memory array formed on multiple levels above a substrate.

In one aspect the invention provides a method for reading a memory cell of a nonvolatile memory array, each memory cell having a switch able resistor memory element in series with a thin film transistor, said switch able resistor memory element decreasing in resistance when a set voltage is applied thereacross, said method comprising: (a) impressing a read voltage across a selected memory cell, said read voltage and said set voltage being opposite in polarity; and (b) detecting whether the switch able resistor memory element within the selected memory cell has a low resistance state or a high resistance state.

In another aspect the invention provides a method for reading one or more memory cells of a nonvolatile memory array, each memory cell having a switch able resistor memory element in series with a switch device controlled by an associated select line, together coupled between an associated data line and a parallel associated reference line, said method comprising: (a) biasing a first data line and a parallel first reference line both associated with a first memory cell to impart a read voltage across the first memory cell, a read disturb portion of said read voltage appearing across the switch able resistor memory element within the first memory cell, said read disturb voltage having opposite polarity relative to a set voltage applied across the switch able resistor memory element during programming to change the switch able resistor memory element from a high-resistance state to a low-resistance state; (b) applying a voltage to a first select line associated with the first memory cell sufficient to turn on the switch device within the first memory cell; and (c) sensing a voltage or current developed on one of the first data line and first reference line in accordance with the resistance of the switch able resistor memory element within the first memory cell.

In yet another aspect the invention provides a method for reading a memory cell of a nonvolatile memory array, each memory cell having a switch able resistor memory element in series with a transistor switch device, said switch able resistor memory element decreasing in resistance when a set voltage is applied thereacross, said method comprising: (a) impressing a read voltage across a selected memory cell, said read voltage and said set voltage being opposite in polarity; and (b) detecting, from a group of at least three programmable resistance states, the resistance state of the switch able resistor memory element within the selected memory cell.

In still another aspect the invention provides an integrated circuit comprising: (a) an array of non-volatile memory cells, each memory cell having a switch able resistor memory element in series with a thin film transistor, said switch able resistor memory element decreasing in resistance when a set voltage is applied thereacross; (b) circuitry for impressing the set voltage across the switch able resistor memory element of a selected memory cell during a programming operation, and for impressing a read voltage across the selected memory cell during a read operation, said read voltage and said set voltage being opposite in polarity; and (c) circuitry for detecting, from a group of at least two programmable resistance states, the resistance state of the switch able resistor memory element within the selected memory cell.

Each of the aspects and embodiments of the invention and the inventive features described herein can be used alone or in combination with one another. The invention in several aspects is suitable for integrated circuits having a memory array, for methods for operating such integrated circuits and memory arrays, and for computer readable media encodings of such integrated circuits or memory arrays.

The foregoing summary is illustrative only and is not intended to be in any way limiting of the invention, which is defined by the following claims. Other aspects, inventive

DESCRIPTION OF THE PREFERRED EMBODIMENTS

Figure 1:
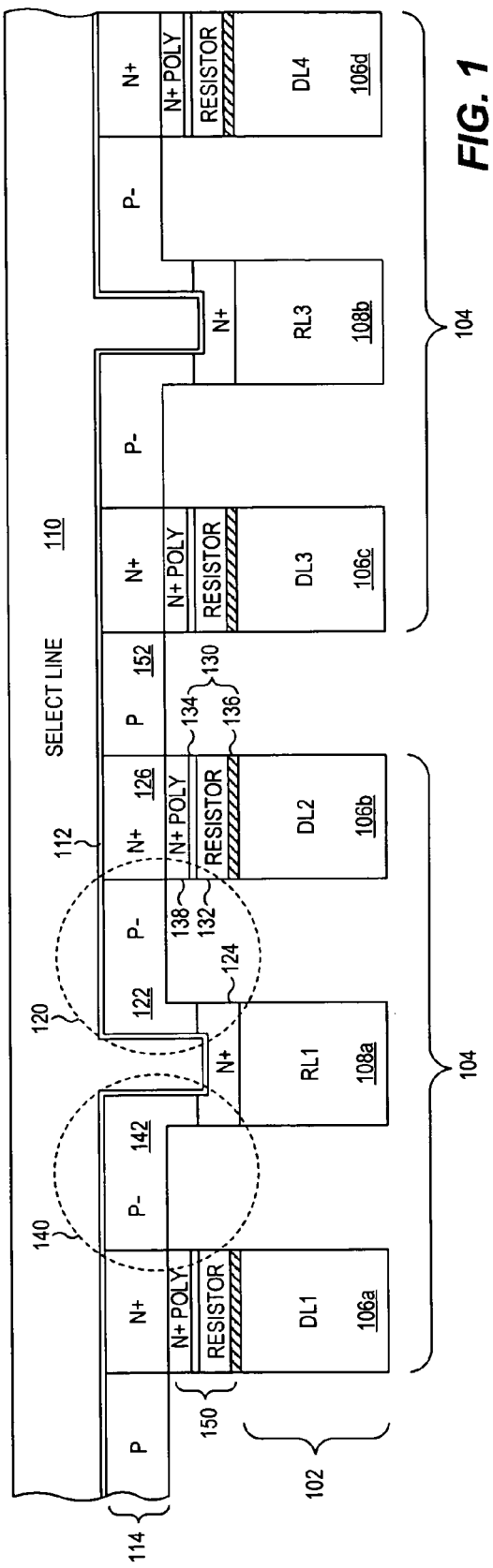
FIG. 1 is a cross-sectional view of an exemplary memory cell structure useful for the present invention.

It has been noted that some materials can be reversibly switched between more than one stable resistivity state, for example between a high-resistivity state and a low-resistivity state. For certain materials, the conversion from a high-resistivity state to low-resistivity state is affected by applying a voltage of a certain magnitude, called a set voltage magnitude, in one direction, while the reverse conversion, from a low-resistivity state to a high resistivity state, is affected by applying a voltage magnitude, called a reset voltage magnitude, in the opposite direction (i.e., opposite polarity).

A basic structure of a switch able resistor memory element for a non-volatile memory cell can be constructed by forming a variable resistance material between two electrodes. One such variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_{1-X}Ca_XMnO_3$ (PCMO), $La_{1-X}Ca_XMnO_3$ (LCMO), LaSrMnO$_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716.

A preferred material is taught by Campbell et al. in U.S. patent application Ser. No. 09/943,190, and by Campbell in U.S. patent application Ser. No. 09/941,544. This material is doped chalcogenide glass of the formula $A_XB_Y$, where A includes at least one element from Group IIIA (B, Al, Ga, In, Tl), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof The dopant is selected from among the noble metals and transition metals, including Ag, Au, Pt, Cu, Cd, Ir, Ru, Co., Cr, Mn or Ni. As will be described, in the present invention this chalcogenide glass (amorphous chalcogenide, not in a crystalline state) is formed in a memory cell adjacent to a reservoir of mobile metal ions. Some other solid electrolyte material could substitute for chalcogenide glass.

Exemplary variable resistance materials include many cases where the set threshold voltage is less than 1 volt, and some as low as 200 mV, which make them suitable for scaling.

The operation of chalcogenide glass in a memory cell is described more fully in the aforementioned Scheuerlein I and Scheuerlein II applications previously incorporated. Briefly, under voltage applied in one direction, mobile metal ions migrate from the adjacent ion reservoir, forming a conductive bridge through the chalcogenide layer. When the voltage is reversed, the metal ions migrate back into the ion reservoir, dissolving the conductive bridge and returning the chalcogenide material to its original high-resistivity state. In addition, additional descriptions of the formation of memory cell structures using such materials may also be found in these referenced applications.

Referring now to FIG. 1, a cross-sectional view is shown of a portion of an exemplary memory array 100 showing several memory cells. Each memory cell includes a field effect transistor and a switch able resistor memory element in series, together coupled between an associated data line and an associated reference line. In preferred embodiments, the PET may be a thin-film transistor adapted to be formed in a monolithic three dimensional memory array having more than one level of memory cells, thus forming a highly dense memory device. One such memory level is shown in the figure, which may represent one level of a three-dimensional array, or a two-dimensional array. Substantially parallel rails 102 (shown in cross section, extending out of the page) include a plurality of line sets 104, each line set 104 consisting of two data lines 106 (106a and 106b, for example) and one reference line 108 (108a, for example) immediately adjacent to and between the two data lines 106a and 106b. Above the rails 102 and preferably extending perpendicular to them are substantially parallel select lines 110. Select lines 110 are coextensive with gate dielectric layer 112 and channel layer 114. Transistors are formed between each adjacent data line and reference line pair. For example, transistor 120 includes channel region 122 between source region 124 and drain region 126. Each select line 110 controls the transistors it is associated with. Switch able resistance memory element 130 is disposed between channel region 122 and data line 106b. In this embodiment, adjacent transistors share a reference line; for example transistor 120 shares a reference line 108a with transistor 140. Transistor 140 also includes a switch able resistor memory element 150 between channel region 142 and data line 106a. No transistor exists in the region 152 between adjacent data lines 106b and 106c. A potential leakage path between data lines 106b and 106c may be prevented either by selectively doping channel layer 114 in this region 152 (as shown in the figure as a P doped region) or by removing this section of channel layer 114 using a channel trim masking step (not shown).

The switch able resistor memory element 130 includes a chalcogenide layer 132 located between two electrodes 134, 136. Chalcogenide layer 132 is amorphous, and is high-resistivity as formed, so switchable resistor memory element 130 is in a high-resistance state. Preferably the switchable resistor memory element 130 is a germanium containing chalcogenide. Electrode 136 is a source of mobile metal ions, preferably silver, and may be thought of as the anode electrode. Electrode 134 is any conductor which will not readily provide mobile metal ions, for example tungsten, aluminum, nickel, platinum, or heavily doped semiconductor material, and may be thought of as the cathode electrode. As can be seen, the cathode electrode is on the channel side of the resistor, while the anode electrode (i.e., the reservoir of mobile ions) is on the data line rail side of the resistor. The N+ doped polysilicon layer 138 may be used to up-diffuse dopants into the channel layer 114, to form the source region 126.

The transistor 120 is preferably a thin film transistor (TFT) formed of deposited Si, a Si—Ge alloy or Ge about 200 to 500 Angstroms thick with a HDP silicon dioxide gate layer and a word line. A TFT containing germanium or a silicon-germanium alloy can provide a lower threshold voltage and/or lower resistance switch device. It is preferable for memory cells with especially low threshold resistor material or for scaled technology where it is desirable to decrease voltages such as the select line voltage (due to the lower Vt of the device) and the drain-to-source voltage (due to the higher mobility of devices with SiGe alloys). The select line 110 may be any suitable conductor such as a doped polysilicon which is then salicided, or a tungsten-containing material. A corrugated channel reduces the short channel effect and allows very small spacing between data line rails without excessive short channel effects.

Additional fabrication details of such memory cells are described more fully in the aforementioned Scheuerlein I and Scheuerlein II applications previously incorporated. In addition, other cells suitable for use with this invention are described in these same applications.

Figure 2:
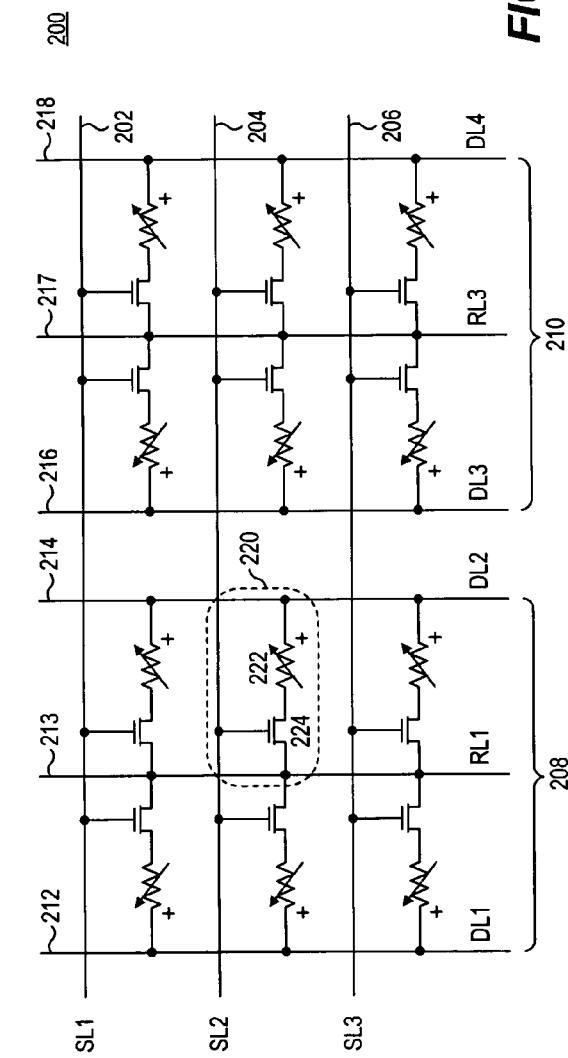
FIG. 2 is a schematic diagram representing an exemplary memory array structure as represented in FIG. 1.

Referring now to FIG. 2, a schematic diagram is shown of a memory array 200 such as that shown in FIG. 1. Three select lines 202, 204, 206 are shown, as well as two reference lines 213, 217 and four data lines 212, 214, 216, 218. Data lines 212, 214 and reference line 213 together form line set 208, and data lines 216, 218 and reference line 217 together form line set 210. The data lines are generally parallel to the reference lines (slight skews excepted), and both are generally perpendicular to the select lines. A total of twelve different memory cells are shown associated with various ones of these array lines. For example, memory cell 220 is associated with select line 204, data line 214, and reference line 213. The memory cell 220 includes a switchable resistor memory element 222 in series with a switch device 224, together coupled between the data line 214 and the reference line 213. Here, the switch device 224 is shown as a three-terminal transistor switch device, and more specifically, as a field effect transistor. The switchable resistor memory element 222 is indicated with a plus-sign ("+") at its end closest to the data line 214 to indicate the anode electrode. As will be described below, other memory cell configurations having the resistor connected to the reference line are also contemplated.

In the configuration shown, such select lines may be thought of by some as word lines, and the data lines may be thought of by some as bit lines. While such terminology is believed to be widely adopted by many in the art for many types of memory array structures, such terminology may imply, to some, a particular organization of the memory array, such as word width, page size, block size, etc., which may be limiting and is unintended herein. Consequently, the description that follows will generally use the more general terms of select lines, data lines, and reference lines.

Figure 3:
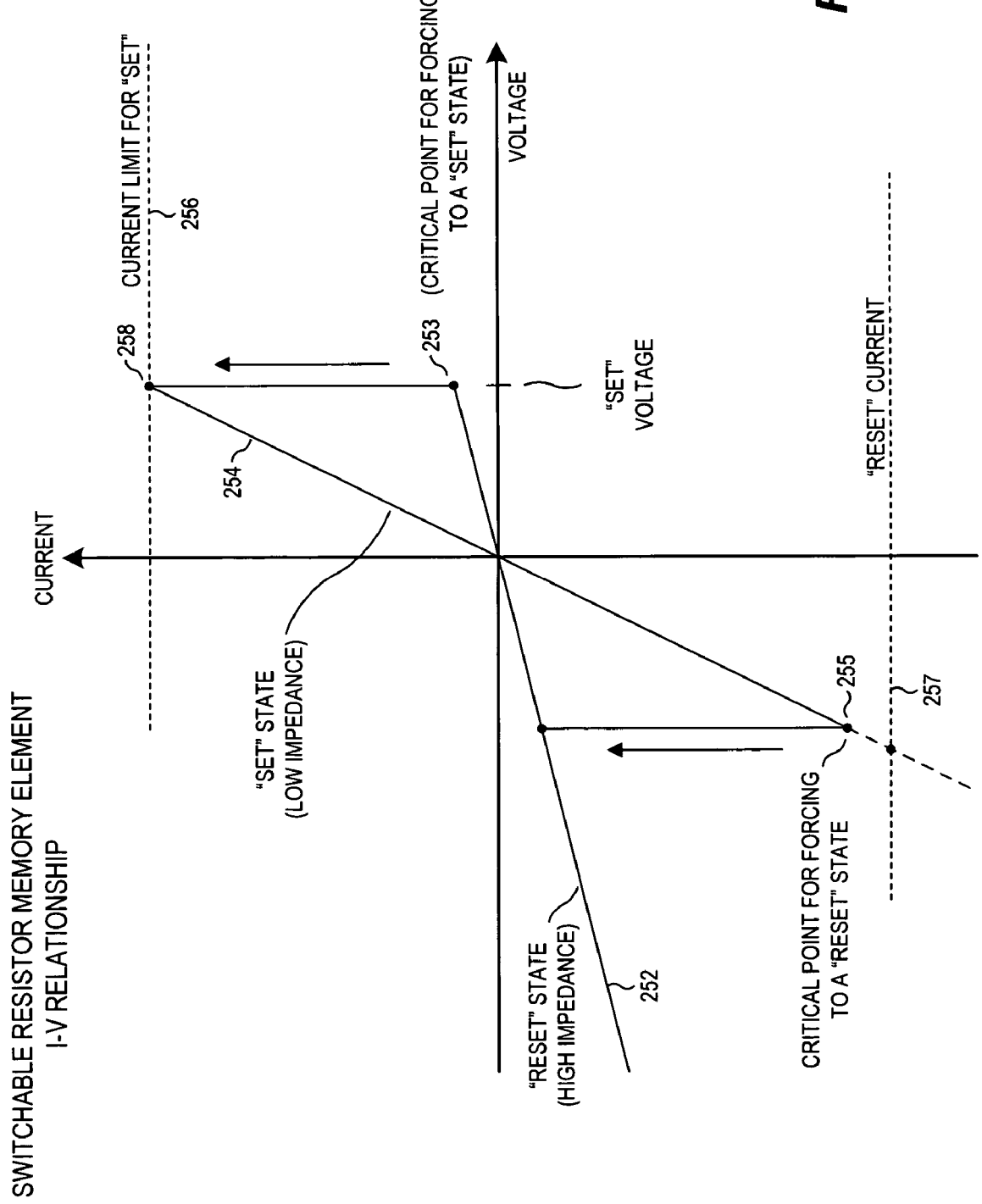
FIG. 3 is a diagram of the current-voltage relationship of an exemplary switch able resistor memory element.

Referring now to FIG. 3, an I-V curve (i.e., current-voltage curve) is shown which illustrates the basic operation of an exemplary switchable resistor memory element within the memory cell. When a positive voltage of a sufficient magnitude is applied to the anode electrode (e.g., electrode 136 in FIG. 1) relative to the voltage of the cathode electrode (e.g., electrode 134 in FIG. 1), electrons flow toward the anode electrode, while silver ions migrate from the anode electrode into the chalcogenide layer (e.g., the variable resistor material layer 132 in FIG. 1). The silver forms a conductive bridge across the chalcogenide layer, and the switchable resistor memory element is set to a low-resistance state. The critical voltage for causing this state change to occur may be called the write threshold voltage or the "set" voltage (labeled 253), and this causes the switchable resistor memory element to change from a high resistance state (shown as a linear I-V curve labeled 252) to a low-resistance state (shown as a linear I-V curve labeled 254). The actual resistance of the low-resistance state may continue to decrease as additional mobile ions (e.g., Ag ions) migrate into the variable resistor material layer, and so may be controlled by limiting the set current to a particular value of current (labeled as 256).

To change the switchable resistor memory element back to its high resistance state 252, the voltage across the switchable resistor memory element is reversed. A negative voltage is applied to the anode electrode relative to the voltage on the cathode electrode. Electrons flow toward the cathode electrode, the silver in the chalcogenide layer is oxidized, and silver ions migrate back into the anode electrode, thus breaking down the conductive bridge, and leaving the chalcogenide layer once again in its high-resistance state. The critical voltage for causing this state change to occur may be called the "reset" voltage (labeled 255), and this causes the switchable resistor memory element to change from the low resistance curve 254 to the high resistance curve 252.

For certain materials the SET voltage may be as low as 200 to 300 mV at a low current level. Also, the RESET voltage is likewise about −200 to −300 mV (about the same voltage, but much higher current).

The difference in resistance between the low-resistance and high-resistance states of the switchable resistor memory element may be readily and repeatably detectable, and in this way a memory state (data "0" or data "1", for example) can be stored into a memory cell and then later read. Of course, it is arbitrary which resistance state corresponds to a data 0 or a data 1. It may be customary to view certain non-volatile memory cells as being "programmed" to a data "0" state and "erased" to a data "1" state, but such association with specific data states is also arbitrary. It may also be customary to view non-volatile memory cells as being in an "erased" state as initially fabricated, and which cells are "programmed" to the other state, irrespective of which data states (i.e., data 1 and 0) correspond to such programmed and erased states. As used herein, memory cells may be programmed (i.e., written) to either data state. The "set" state refers to the low resistance state and the "reset" state refers to the high resistance state. A switchable resistor memory element is changed from a high-resistance state to a low-resistance state by applying a set voltage across the element having a certain magnitude and polarity (e.g., a "forward biased" resistor), while the reverse conversion is affected by applying a reset voltage having a certain magnitude and of the opposite polarity (e.g., a "reverse biased" resistor). The set and reset operation can be repeated many times. Any colloquial use herein of any of these various terms shall not be interpreted in conflict with this understanding or in a limiting manner. For convenience, "erasing" may be used to refer to an operation to change the switchable resistor memory element to its high resistance state. In such a context, "programming" may then be used to refer to an operation to change the switchable resistor memory element to a low resistance state. Thus, a programmed memory cell has been "set" to its low resistance state, and an erased memory cell has been "reset" to its high-resistance state.

It is important to carefully control the circuit conditions experienced by each cell during read, write, and erase. For example, when programming a cell to its low resistance state, if too little current is used to form the conductive bridge, the cell will not be highly conductive, the conductive state may be unreliable, and the difference between the programmed and unprogrammed state will be difficult to detect. If too much current is provided, the conductive bridge formed across the chalcogenide layer becomes so conductive that when an erase is attempted, the resistance of the conductive bridge is too low (the current is too high) to allow enough voltage to easily build up across the switchable resistor memory element sufficient to cause the silver in the bridge to oxidize and to migrate back to the anode electrode.

Referring still to FIG. 3, such relationships are illustrated. When programming a memory cell, preferably the current flowing through the switch able resistor memory element is limited to a certain value. This current limit for "set" (labeled 256) controls the magnitude of the low resistance state as the operating point of the switchable resistor memory element jumps upward from the critical set point (labeled 253) until it is limited by the set current limit 256.

When erasing a programmed memory cell, a sufficiently high amount of current must conduct through the memory cell to allow the switchable resistor memory element to reach the reset critical point 255. To ensure adequate margin, preferably a minimum amount of current 257 is provided through such device, which is by design more current than needed to reach the critical reset point 255 (i.e., the current magnitude crosses the I-V curve "below" the critical reset point, as shown).

Figure 4:
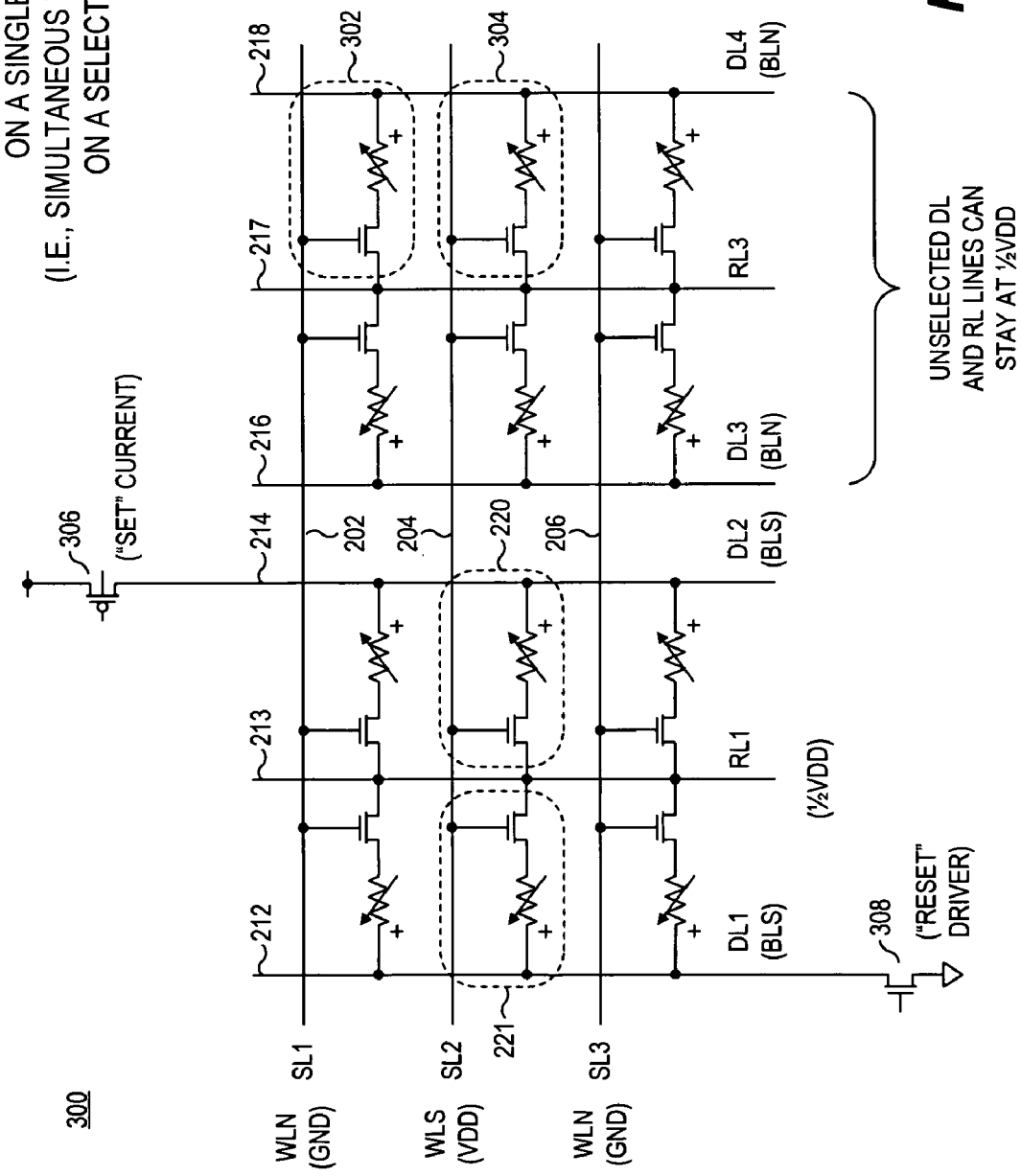
FIG. 4 is a schematic diagram depicting conceptual write conditions for certain embodiments of the present invention.

Referring now to FIG. 4, the exemplary memory array 200 is shown (here labeled 300) with an exemplary write bias. The select lines 202, 206, the data lines 216, 218, and the reference line 217 are assumed to be unselected. The selected line 204, the data lines 212, 214, and the reference line 213 are assumed to be selected, and thus memory cells 220, 221 are selected. In the figure shown, the selected memory cell 220 is shown as being programmed, while the selected memory cell 221 is shown as being erased.

In this embodiment, the unselected data lines 216, 218 and unselected reference line 217 are biased at a write standby voltage of approximately one-half VDD and unselected select lines 202, 206 are biased at ground. As used herein, VDD represents a power supply voltage operably coupled to such a memory array. VDD could be supplied by a connection to voltage sources outside the integrated circuit or produced by circuitry on the integrated circuit itself. While not necessarily required, VDD is preferably a positive voltage relative to a ground reference voltage (i.e., GND or "ground"). The unselected memory cells (e.g., unselected memory cell 302) and the half-selected memory cells (i.e., those cells, such as memory cell 304, associated with a selected word line (e.g., select line 204) contribute no power dissipation since the data line and reference line associated with each unselected and half-selected memory cell are both biased at the same voltage, and therefore no voltage is impressed across such memory cells.

In this embodiment the selected reference line(s) is also biased at ½ VDD, which allows one of the associated selected data lines to be biased at a higher voltage to program memory cell 220, and also allows the other associated selected data line to be biased at a lower voltage to erase memory cell 221. In other words, with the selected reference line biased at ½ VDD, the switchable resistor memory element within memory cell 220 may be forward biased and yet the switchable resistor memory element within memory cell 221 may be reversed biased. As long as the magnitude of the VDD voltage is large enough, both the set voltage and the reset voltage may be adequately developed across the respective resistor elements to simultaneously write a data 0 into one or more cells and write a data 1 into one or more other cells. Such a capability may be termed a direct write of both data 0 and data 1 states, and avoids any requirement for a block erase operation as is common in certain flash memory devices.

The data line 214 is biased to a VDD through a current limiting circuit 306, here shown as a PMOS device as might be employed in a current mirror circuit (with an appropriate bias on its gate terminal) or other suitable current limiting circuit. The magnitude of this current limiting circuit 306 is preferably set to provide a current equal to the set current limit 256 through the selected memory cell 220. For ease of understanding the bias conditions, this current limiting circuit 306 is shown conceptually as being directly connected to the selected data line 214. In many practical embodiments, there may actually be one or more intervening circuits, such as select devices, decoder circuits, etc. This current limiting circuit 306 may nevertheless be viewed as being coupled to the selected data line 214. Of course, any such intervening circuits should be carefully designed to not significantly interfere with the development of the necessary set voltage across the selected memory cell's resistor element at a current which is limited to the desired set current limit.

The data line 212 is biased to a ground through a current providing circuit 308, here shown as an NMOS device as might be employed in a driver circuit or other suitable current providing circuit. Such a driver circuit may as simple as a reasonable sized driver device coupled to a bias level, with a simple digital control used to control the device (to avoid providing another current value into the array). The magnitude of this current providing circuit 308 is preferably set to provide a current equal to the reset current 257 through the selected memory cell 221. As before, for ease of understanding the bias conditions, this current providing circuit 308 is shown conceptually as being directly connected to the selected data line 212. In many practical embodiments, there may actually be one or more intervening circuits, such as select devices, decoder circuits, etc. This current providing circuit 308 may nevertheless be viewed as being coupled to the selected data line 212. Again, any such intervening circuits should not significantly interfere with the development of the necessary reset voltage across the selected memory cell's resistor element at a current level at least that of the minimum reset current (and preferably with some margin higher than such reset current).

As mentioned above, it is important that the RESET current driver provides a current at least equal in magnitude (and opposite in polarity) to the SET current to ensure that the reset driver can force a voltage across the switchable resistor memory element that is greater than the RESET voltage. Accordingly, the SET current limit is substantially less than the minimum RESET current to ensure that memory cells do not get "stuck" in the SET state. In other words, $I_{SET}<I_{RESET}$ for proper operation.

While a single line set of array lines is shown in FIG. 4 as being selected (i.e., in this embodiment a single reference line and two associated data lines), additional line sets may also be selected to thus select additional data lines. Accordingly, a plurality of memory cells along a selected word line can be written to an arbitrary choice of the set or reset data states, respectively, in the same operation, thereby providing for a direct write of 0 or 1 data states, i.e. avoiding the use of a block mode erase operation as in many types of Flash memory.

In the embodiment shown, such a direct write capability is provided even though only positive voltages are used for the various array lines. Alternatively, in some other embodiments, both positive and negative voltages may be utilized. For example, the selected reference line could be biased at ground, and a positive voltage used to set a selected memory cell, and a negative voltage used to reset a selected memory cell. In this case the unselected data lines 216, 218 and unselected reference line 217 are preferably biased at a write standby voltage of ground.

The bias conditions shown in FIG. 4 also provide for a low latency write capability. Between write operations (i.e., write cycles), all data lines and reference lines can be biased at a write standby voltage of ½ VDD, and all select lines can be biased at ground. Then, to write a memory cell, a selected word line is driven high, and the selected data lines are biased above or below the write standby voltage. The bulk of the memory array lines need not be re-biased to accomplish the write operation. In particular, there is no need for charge pump circuits to drive many unselected lines to voltages above VDD (i.e., above the highest power supply voltage operably coupled to the memory array), which can require considerable time before the write could proceed. If desired, the selected word line voltage can be capacitively coupled above VDD for higher drive on the TFT devices within the memory cells. Preferably the selected word line may be boosted to a voltage of VDD plus about 1.0 to 1.5 volts.

In some embodiments suitable for very low VDD operation, the reference line may be biased at VDD and the selected data line biased to either ground or a boosted level of about 2VDD (such as might be generated using charge pump circuits or other suitable circuits). Such an embodiment would be useful if the VDD power supply choice is less than the voltage required to set or reset the memory cell through the various drivers and the IR drops of the memory array lines. Such a boosted data line would likely increase write latency and/or increase power dissipation to operate such charge pump circuits.

It should be noted that because the reference lines and the data lines are parallel, and both are perpendicular to the word lines, any given reference line only must support current flow through at most two selected memory cells. As a result, voltage drops due to the resistance of the reference line (i.e., so-called "IR drops") are reduced. Such IR drops can negatively affect both the writing and particularly the reading of such memory cells, as described in more detail below. Moreover, in other embodiments described herein, each selected reference line supports current flow through only a single selected memory cell.

While the reset driver 308 and the set current limiting circuit 306 are shown, for clarity of illustrating exemplary voltage bias levels, as being coupled to respective data lines at opposite ends thereof, in many practical memory array embodiments both such circuits may be located in close physical proximity to each other, and may both be coupled to the respective data lines at the same end of such data lines.

Figure 5:
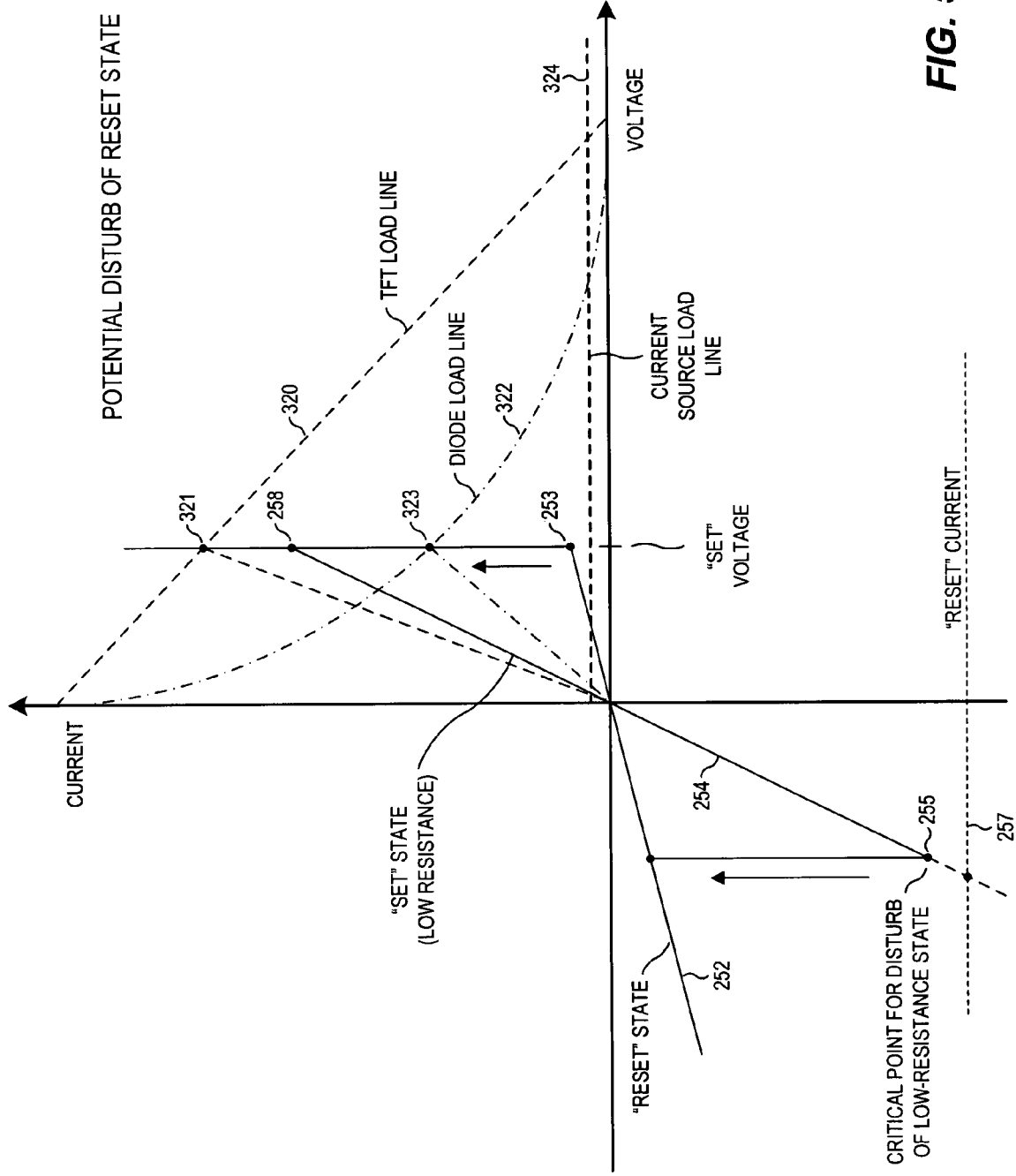
FIG. 5 is a diagram of the current-voltage relationship of an exemplary switch able resistor memory element to illustrate potential read disturb of the element.

Referring now to FIG. 5, the potential disturb of a reset state during a read operation con occur when the memory cell is biased with a forward biased voltage across the switchable resistor memory element. A liner TFT load line 320 is shown in the upper-right quadrant of the I-V curve, corresponding to a positive voltage being impressed across a selected memory cell (i.e., a voltage across the memory cell resulting in a forward biased resistor element), or in other words, a read voltage having the same polarity as the set voltage on the switchable resister memory element.

This TFT load line 320 intersects the operating curves for the switchable resister memory element well above the corresponding to the set voltage (i.e., point 253), and results in a disturb of the memory cell to a lower resistance state. In the case depicted, the resistance would be disturb to the point 321 which may be above the normal set current value (point 258) as is shown, or which may be below such point 258 (e.g., point 323, as shown for an exemplary diode load line 322), but in any case represents a total destruction of the memory cell data from the high resistance state to a low resistance state.

Alternatively, a constant load current may be utilized, represented by a flat load line 324, to ensure that the voltage across the switchable resistor memory element does not reach the set voltage. Such a constant current would need to be less in magnitude than the current corresponding to the set voltage (i.e., the current at point 253). Such small values of current, particularly for large, heavily loaded array lines, would lead to very long time constants for array lines to stabilize, and thus would increase the time to sense the data state of the memory cell. Moreover, even small amounts of noise could still trigger a disturbance of one or more memory cells.

Using a forced voltage at a very low level (e.g., 100 mV) with current mode sensing avoids disturb because the voltage across the switchable resistor memory element can never reach the set voltage. But this requires a very low resistance switch device within the memory cell, and the voltage control problems of such low voltages still risk disturb. This is particularly difficult in 3D memory arrays where the arrays are potentially subject to more noise, and where the array lines could be of higher resistance materials. In addition, it is more difficult to fabricate a very low resistance switch device in such 3D memory arrays, and the load line slope of the switch device should be comparable to the low resistance state to not lose signal.

On one hand, the low set voltage of such switchable resistor memory elements makes them very suitable for scaling and use in high density memory arrays. Many such materials have a set threshold voltage that is less than 1 volt, and some as low as 200 mV. On the other hand, however, due to such very low set thresholds, it is difficult to read the data state of the memory cell with good performance and without disturbing the memory cell.

Figure 6:
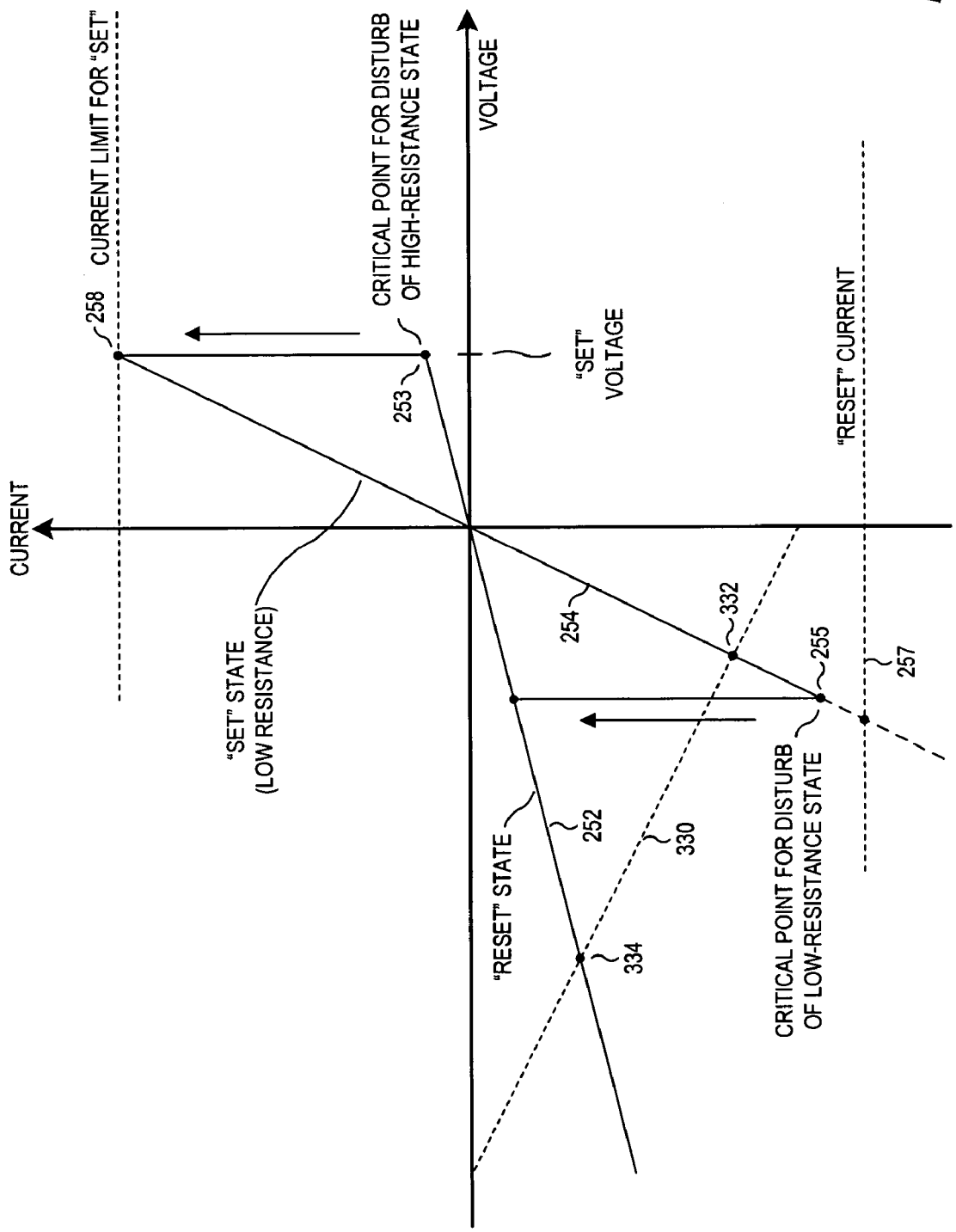
FIG. 6 is a diagram of the current-voltage relationship of an exemplary switch able resistor memory element depicting preferred read conditions for some embodiments of the present invention.

Referring now to FIG. 6, the switching behavior of the resistor element and the load line representing the resistance of the TFT switch device during a read with reverse bias is shown. A linear TFT load line 330 is shown in the lower-left quadrant of the I-V curve, corresponding to a negative voltage being impressed across a selected memory cell (i.e., a voltage across the memory cell resulting in a reverse-biased resistor element), or in other words, a read voltage having the opposite polarity as the set voltage of the switchable resistor memory element. The resistance and therefore the slope of the switch device load line 330 preferably is comparable to the low resistance state (load line 254) so as not to dilute the signal available from the cell. In this read method the read voltage magnitude can be significantly larger than the switching threshold of the low resistance state (i.e., the set voltage) while avoiding disturb concerns. The current sensed is indicated by the intersection points with the SET state line (labeled 332) and RESET state line (labeled 334). The read point 334, as can be seen, resides at a greater voltage magnitude than the set voltage (although opposite in polarity). The available signal may actually be a little larger than shown because the switchable resistor memory element is preferably on the data line side of the memory cell, which may act as the source side of the TFT switch device when reading the memory cell. The bias of the source decreases the current through the TFT for the high resistance state, and yet hardly changes the current through the TFT for the low resistance state. The resistance of the TFT device is preferably comparable to the low-resistance state In various embodiments herein, the read voltage impressed across a selected memory cell may be larger in magnitude than the set voltage of the memory cell. The read voltage impressed on the array may for convenience in circuit design be as large as the programming voltages applied to the array. This may be accomplished by using a bias voltage on the select line (e.g., the word line) that is higher during programming than during read. This provides for a select device having as low a resistance as possible during the set operation (subject to device breakdown limitations), and particularly helps realize a switch device having a resistance low enough to allow the application of the desired current limit for set. As seen in FIG. 6, in reverse bias during read the load line of the TFT has a higher voltage drop i.e. flatter load line than the IV curve of the low resistance state accomplished by using a bias voltage on the select line that is lower during read than was used during write. This protects the low resistance state from disturb during reading as the load line intersects the low resistance I-V curve (at point 332) significantly below the critical point for disturb of the low resistance state (i.e., the reset voltage, point 255).

As shown in FIG. 6, in reverse bias the TFT has a lower voltage drop i.e. steeper load line than the IV curve of the high resistance state. Hence the high resistance state sees a high bias voltage under read conditions. The high resistance state is inherently protected from disturb under these conditions because the bias voltage is in a direction to reinforce the change to the high resistance state. This protects the high resistance state from disturb.

Figure 7:
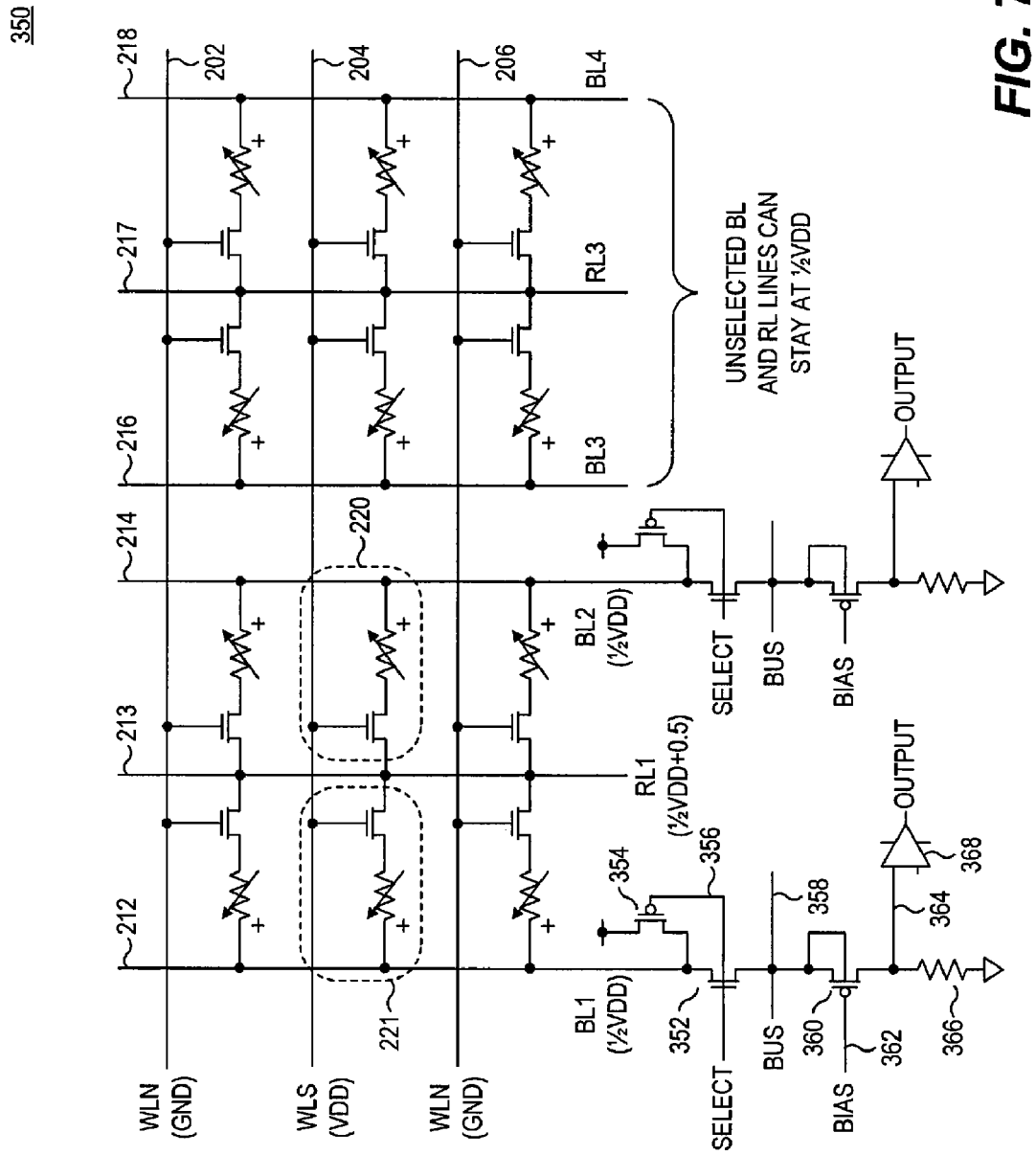
FIG. 7 is a schematic diagram of an exemplary read circuit consistent with some embodiments of the invention.

Referring to FIG. 7, a read circuit arrangement 350 is shown which utilizes voltage-clamped data line sensing. As before in regards to the programming discussion, the select lines 202, 206, the data lines 216, 218, and the reference line 217 are assumed to be unselected. The select line 204, the data lines 212, 214, and the reference line 213 are assumed to be selected, and thus memory cells 220, 221 are selected.

In this embodiment, the unselected array lines (i.e., unselected data lines, reference lines, and select lines) are biased at a read standby voltage equal to ½ VDD. The unselected memory cells and the half-selected memory cells (i.e., associated with a selected word line but an unselected data line) contribute no power dissipation since the data line and reference line associated with each such cell are both biased at ½ VDD, and thus no voltage is impressed across such memory cells.

In this embodiment the selected reference line(s) is driven to a voltage above ½ VDD (e.g., ½ VDD+0.5 volts), which reverse biases both selected memory cells 220, 221. The selected data line 212 is voltage clamped to ½ VDD (and thus biased to ½ VDD). Current flowing on the selected data line 212 through the selected memory cell 221 is sensed to determine whether the switchable resistor memory element within the selected memory cell 221 is in the set data state or the reset data state. The selected word line 204 is driven to VDD and unselected word lines WLN 202, 206 are maintained at ground potential. The standby biases are compatible with the biases of some of the write embodiments such as the write method described above and shown in FIG. 4 for low latency read and write operations.

A two device driver circuit (transistors 352, 354) is connected to each data line. If the data line is selected, a SELECT signal 356 enables device 352 to couple the selected data line 212 to a bus line 358. Conversely, if the particular data line is unselected, the SELECT signal 356 enables device 354 to couple the unselected data line to ½ VDD, and device 352 is off to thereby decouple an unselected data line from the bus line 358.

A clamp device 360 is biased with a BIAS signal 362 having a magnitude appropriate for maintaining the selected data line at about ½ VDD. Such a bias voltage 362 may be generated using a feedback-controlled circuit which comprehends the ½ VDD voltage, the threshold voltage of the PMOS transistor 360, device temperature, etc. A resistor 366 coupled between node 364 and ground represents a load circuit that provides a reference current which preferably is set to a magnitude halfway between the respective expected cell currents for a low-resistance and a high-resistance data state in the memory cell. An amplifier or comparator circuit 368 compares the signal on node 364 to a reference voltage (not shown) to generate an output signal reflecting the data state of the selected memory cell.

The read circuit shown is somewhat of an idealized circuit, as additional selection or decoding devices may actually be present in the read path between the selected memory cell and the clamp device 360. Exemplary current sensing circuits are described in greater detail in "CURRENT SENSING METHOD AND APPARATUS PARTICULARLY USEFUL FOR A MEMORY ARRAY OF CELLS HAVING DIODE-LIKE CHARACTERISTICS" by Roy E. Scheuerlein, U.S. application Ser. No. 09/896,468, filed Jun. 29, 2001, which application is hereby incorporated by reference in its entirety.

Any such intervening circuits should be designed to not significantly interfere with the read signal. Preferably the resistance of the read path should be designed to be less than or comparable to the switchable resistor memory element in the memory cell to yield good signal margin.

Since the selected reference line 213 is shared with a second data line 214, the memory cell 220 may optionally be sensed at the same time. The read bias conditions depicted provide for a fast read capability, as all non-selected array lines can stay at ½ VDD without consuming power in the array. When an address is received and decoded, the selected word line can be quickly driven to its selected level (even if boosted above VDD) and the selected reference line driven quickly to its selected level. The selected word line preferably is driven to VDD for high read performance, but in other embodiments could be boosted to an active level 1.0 to 1.5 volts above VDD. Other line sets, two data lines and one reference line, can simultaneously be biased to read at least two more memory cells. In an exemplary three-dimensional memory array having four memory levels, an exemplary read configuration may simultaneously read four memory cells from each of the four memory levels, for a total of 16 memory cells.

Figure 8:
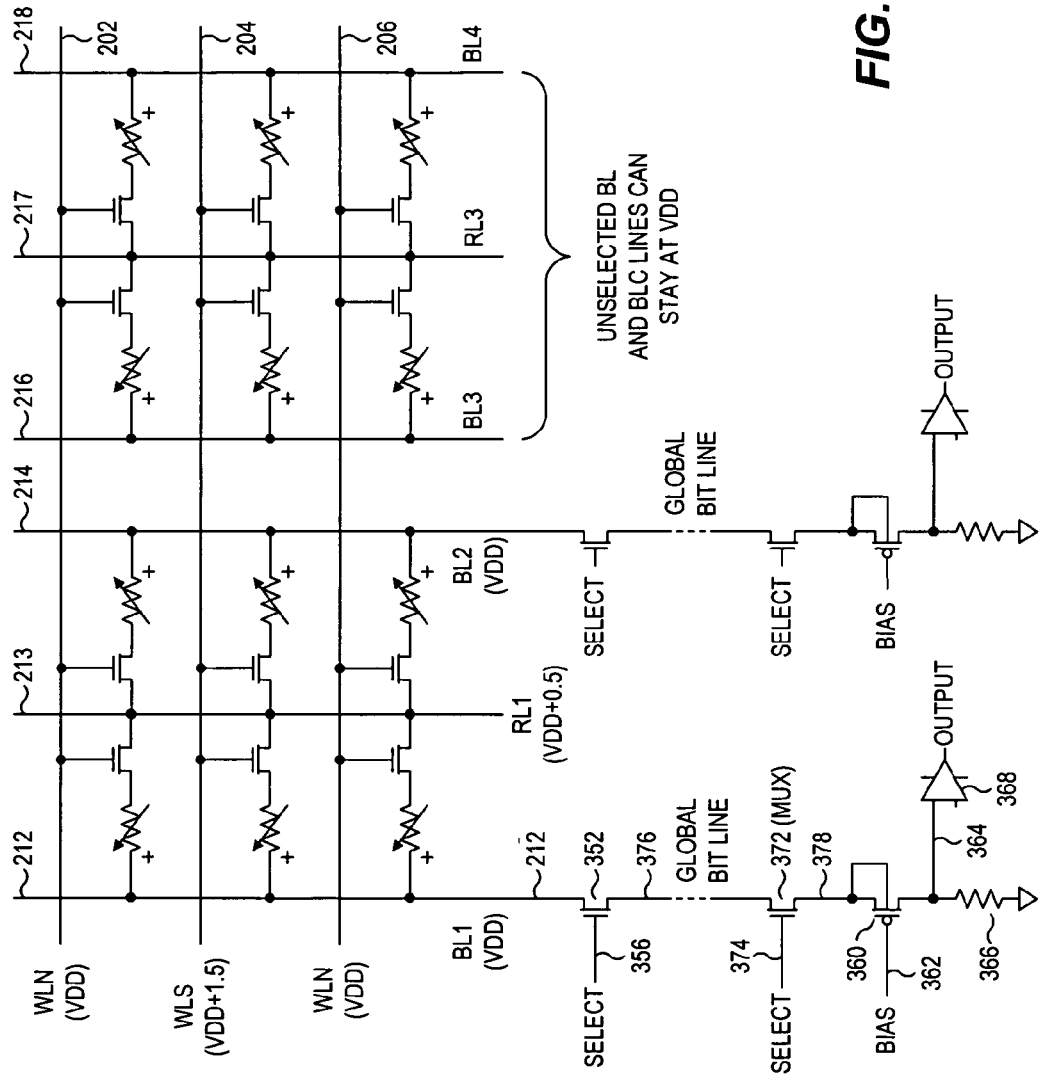
FIG. 8 is a schematic diagram of another exemplary read circuit consistent with some embodiments of the invention.

Referring to FIG. 8, a read circuit arrangement 370 is shown which also utilizes voltage-clamped data line sensing, and which arrangement shows a variation of the selection circuitry of the previous configuration. Using a bias advantageous for low VDD applications, the unselected array lines are biased at a VDD-level read standby voltage. The selected reference line(s) is driven to a voltage above VDD (e.g., VDD+0.5 volts), and the selected data line 212 is voltage clamped to VDD (i.e., biased to VDD). A clamp device 360 is used, as before, to provide this bias, and sensing proceeds as in the previous configuration using a reference current resistor 366 and amplifier 368.

In this configuration, however, a hierarchical data line arrangement is presumed, in which the data lines within the array correspond to local data lines, one of which is selected and coupled to an associated global data line, which is then further selected and steered to the sensing circuit. For example, the data line 212 corresponds to a local bit line, which is coupled by a selection device 352 to a global bit line 376. One or more additional selection devices (e.g., selection device 372) may further be utilized to select one of several global bit lines and couple the selected one to sense and write driver circuitry. Further description of exemplary global bit line arrangements is set forth in U.S. application Ser. No. 10/403,752 by Roy E. Scheuerlein, et al, entitled "Three-Dimensional Memory Device Incorporating Segmented Bit Line Memory Array", filed on Mar. 31, 2003, which application is hereby incorporated by reference in its entirety. Such global bit line configurations may also be employed with many of the embodiments of the present invention described herein.

Since the selected reference line 213 is shared with a second "local" data line 214, the selected memory cell associated with data line 214 may optionally be sensed at the same time. In addition, additional line sets (e.g., in this embodiment, two data lines and their shared reference line) may also be simultaneously selected to allow reading of more than two memory cells at the same time. In another exemplary configuration, eight memory cells from a single memory level may be simultaneously accessed (i.e., read or written).

Figure 9:
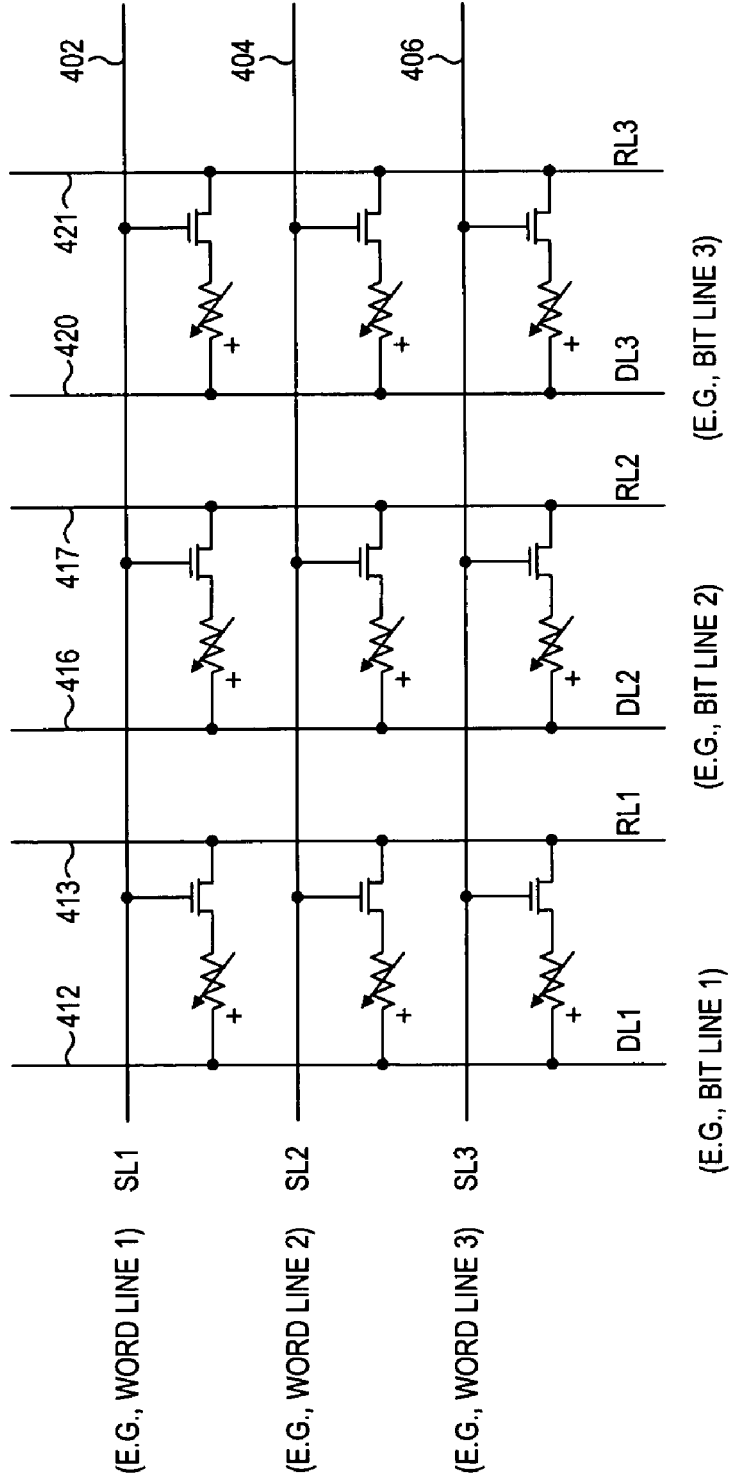
FIG. 9 is a schematic diagram representing an exemplary memory array structure consistent with some embodiments of the invention.

Referring now to FIG. 9, an alternate memory array structure 400 is shown in which each reference line is associated with only a single data line. Three select lines 402, 404, 406 are shown, as well as three reference lines 413, 417, 421 and three data lines 412, 416, 420. Data line 412 and reference line 413 together form a line set. Likewise, data line 416 and reference line 417 together form a line set, and data line 420 and reference line 421 together form a line set. The data lines are generally parallel to the reference lines (slight skews excepted), and both are generally perpendicular to the select lines. A total of nine different memory cells are shown associated with various ones of these array lines.

In the configuration shown, such select lines may also be referred to as word lines, and the data lines as bit lines. Consequently, the select line 402 (also labeled SL1) is in addition labeled parenthetically as word line 1. The remaining array lines are also labeled with alternate terminology, which is provide in the figure for convenience, and not in a limiting sense. For example, even though the data line 416 is also referred to as "e.g., bit line 2", such reference does not preclude such a data line in fact corresponding to a local bit line, or corresponding to some other array line in another configuration. Moreover, use of such convenient terminology should not be taken to necessarily imply any particular organization of the memory array, such as word width, page size, block size, etc.

The memory array structure 400 may be implemented with a similar structure to that shown in FIG. 1, with one of the data lines removed and an isolation region (e.g., region 152) provided between adjacent but not associated array lines (e.g., between reference line RL1 and data line DL2 in FIG. 9). In addition, a memory array structure 400 may be implemented using a vertical TFT device formed below a switchable resistor memory element. Details of exemplary vertical memory cell structures and their formation is set forth in the aforementioned Scheuerlein I application previously incorporated.

Figure 10:
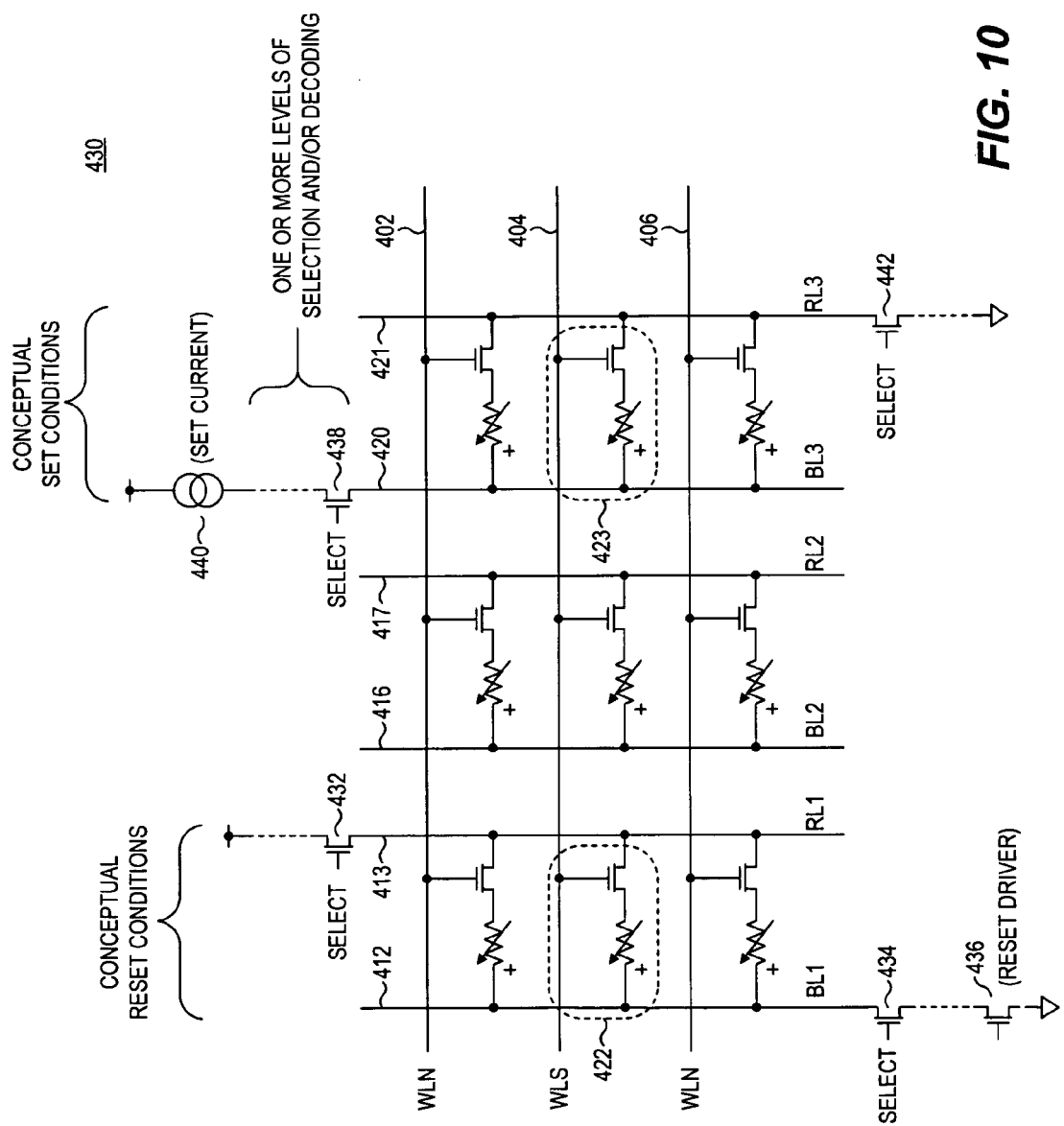
FIG. 10 is a schematic diagram depicting conceptual write conditions for certain embodiments of the present invention using a memory array shown in FIG. 9.

Referring now to FIG. 10, a conceptual method is shown for writing both data 0 and data 1 into a memory array such as that shown in FIG. 9 having non-shared reference lines. The select lines 402, 406 (also both labeled WLN for "word line not selected"), the data line 416, and the reference line 417 are assumed to be unselected. The select line 404 (also labeled WLS for "word line selected"), the data lines 412, 420, and the reference lines 413, 421 are assumed to be selected, and thus memory cells 422, 423 are selected. In the figure shown, the selected memory cell 423 is shown as being "programmed" (changed to the set state), while the selected memory cell 422 is shown as being "erased" (changed to the reset state).

In this embodiment 430, the unselected array lines (i.e., unselected data lines, reference lines, and select lines) are preferably biased at a write standby voltage of ground, although the unselected data lines and reference lines may be biased at any of several other voltages, such as VDD or ½ VDD. The unselected memory cells and the half selected memory cells contribute no power dissipation as there is no voltage impressed across such memory cells.

In this memory array embodiment a selected reference line is biased at a voltage depending upon the data state to be programmed, as is the associated selected data line. In other words, the bias conditions on both a selected data line and its associated reference line both depend upon the data state to be programmed. For example, to program memory cell 423 to the set state, the data line 420 is biased at VDD through a current limiting circuit 440 (configured to limit current flow into the data line to the magnitude of the desired set current), while the reference line 421 is driven to ground through a select device 442. In this manner, the switchable resistor memory element within the memory cell 423 may be impressed with a forward biased voltage greater than the set voltage.

Conversely, to program memory cell 422 to the reset state, the data line 412 is biased at ground by a reset driver 436 (and by way of an intervening select device 434), while the associated reference line 413 is driven to VDD through a select device 432. In this manner, the switchable resistor memory element within the memory cell 422 may be impressed with a reversed biased voltage and driven with sufficient current to exceed the reset voltage across the resistor element.

This arrangement allows the entire VDD voltage to be utilized in developing the requisite set or reset voltage within a selected memory cell. More specifically, it allows almost the entire VDD voltage to be impressed across a selected memory cell, to promote developing a voltage across the switchable resistor memory element within the selected memory cell that reaches the requisite set or reset voltage. Consequently, this array configuration and write arrangement is particularly well suited for use with a very low power supply voltage, i.e., about half the magnitude of a minimum power supply voltage used for a mid-value reference line biasing scheme as shown in FIG. 4.

Each of the various selection devices 432, 434, 438, 442 may represent one or more levels of decoding and/or selection devices, including use with a hierarchical array line structure (e.g., global bit lines/local bit lines). In many practical embodiments, there may actually be several intervening select devices, decoder circuits, etc. This current limiting circuit 440 may nevertheless be viewed as being coupled to the selected data line 420. Such intervening circuits should be carefully designed to not significantly degrade the voltage on the data line.

The data line 412 is biased to a ground through a current providing circuit, here shown as an NMOS reset driver 436 coupled to a bias level (e.g., ground), with a simple digital control used to control the device, or other suitable current providing circuit. This current providing circuit 436 may be viewed as being coupled to the selected data line 412, notwithstanding one or more intervening selection devices and circuits.

One or more line sets may be simultaneously selected. Accordingly, a plurality of memory cells along a selected word line can be written to an arbitrary choice of the set or reset data states, respectively, in the same operation, thereby providing for a direct write of 0 or 1 data states, i.e. avoiding the use of a block mode erase operation as in many types of Flash memory.

In the embodiment shown, such a direct write capability is provided even though only positive voltages are used for the various array lines. Alternatively, in some other embodiments, both positive and negative voltages may be utilized. For example, the selected reference line could be biased at ground, and a positive voltage used to set a selected memory cell, and a negative voltage used to reset a selected memory cell.

The bias conditions shown in FIG. 10 also provide for a low latency write capability. Between write operations (i.e., write cycles), all array lines can be biased at a particular write standby voltage. Then, to write a memory cell, a selected word line is driven high, and the selected data lines and reference lines are biased in accordance with the data states to be programmed. The bulk of the memory array lines need not be re-biased to accomplish the write operation. Preferably the selected word line may be boosted to a voltage of VDD plus about 1 to 1.5 volts.

It should be noted that because the reference lines and the data lines are parallel, and both are perpendicular to the word lines, any given reference line only must support current flow through a single selected memory cells. As a result, voltage drops due to the resistance of the reference line (i.e., so-called "IR drops") are reduced, and pattern sensitivities may be likewise greatly reduced.

While the reset driver 436 and the set current limiting circuit 440 are shown as being coupled to respective data lines at opposite ends thereof, in many practical memory array embodiments both such circuits may be located in close physical proximity to each other, and may both be coupled to the respective data lines at the same end of such data lines.

Figure 11:
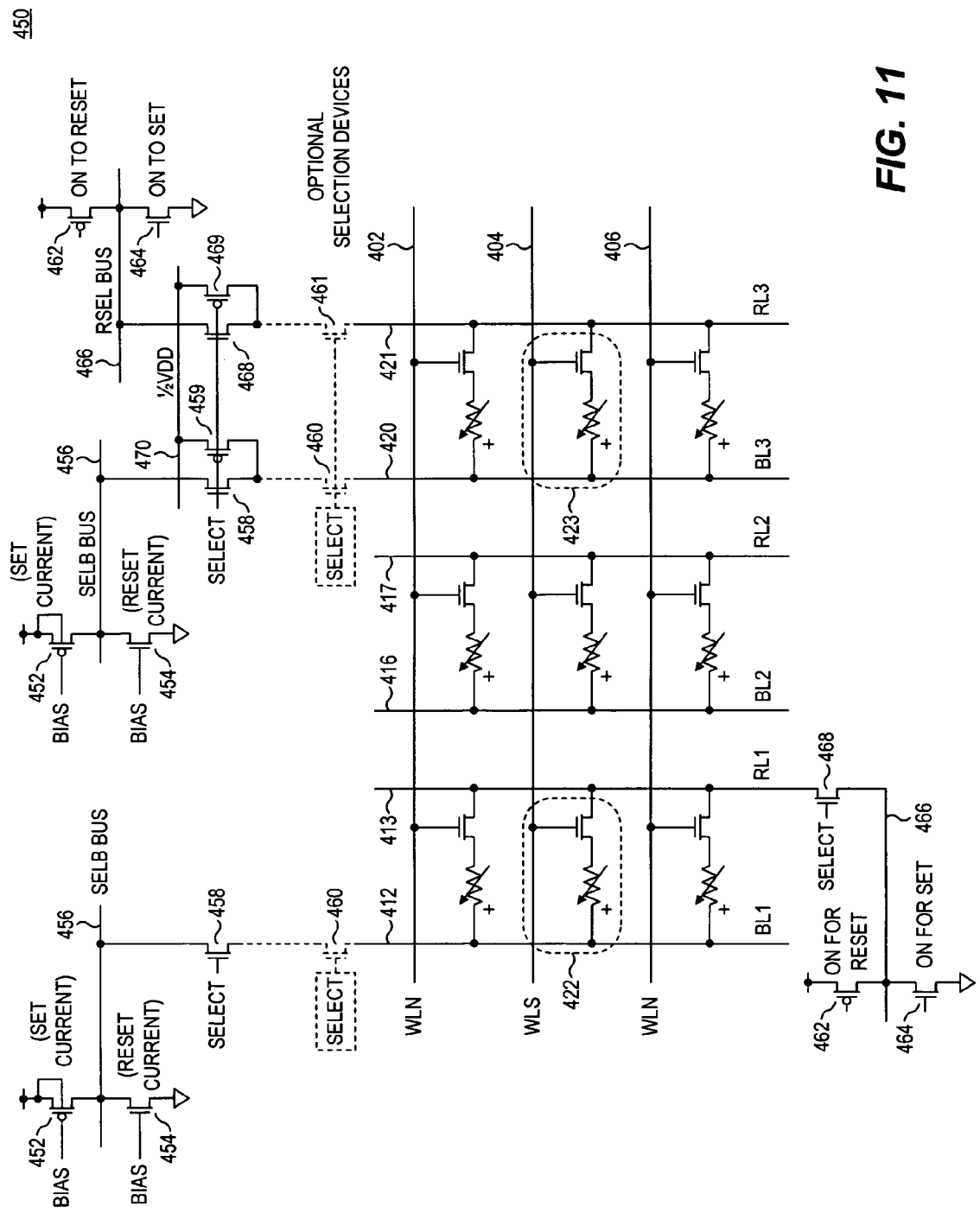
FIG. 11 is a schematic diagram of an exemplary write circuit consistent with some embodiments of the invention.

Referring now to FIG. 11, memory array 450 illustrates an embodiment for write circuitry for a memory array of the type shown in FIG. 9 having non-shared reference lines. This arrangement may be viewed as accomplishing the conceptual configuration described in the previous figure.

Two arrangements are actually depicted in this figure. On the left side of the figure, an arrangement is shown having a data line driver coupled to one end of the data line, and having a reference line driver coupled to the other end of the reference line. To program memory cell 422 to the set state, the data line 412 is biased at VDD through a current limiting circuit 452, while the reference line 413 is driven to ground through a driver device 464. Both the reset driver 454 and the reset driver 462 remain off. Conversely, to program memory cell 422 to the reset state, the data line 412 is biased at ground by a reset driver 454, while the associated reference line 413 is driven to VDD through a reset driver 462, and both set driver 452 and set driver 464 remain off.

The data line 412 is coupled through one or more selection device 458, 460 to a bus line 456, which is then driven high or low by one of the two drivers 452, 454. In addition, the reference line 413 is coupled through one or more selection devices 468 to a bus line 466, which is then driven high or low by one of the two drivers 462, 464. As noted, if the data line is driven high, the reference line is driven low, and vice versa.

On the right side of the figure, an arrangement is shown having a data line driver and a reference line driver coupled to the same ends of the data line and reference line, but otherwise the circuitry and its operation is similar. To program memory cell 423 to the set state, the data line 420 is biased at VDD through a current limiting circuit 452, while the reference line 421 is driven to ground through a driver device 464. Both the reset driver 454 and the reset driver 462 remain off. Conversely, to program memory cell 423 to the reset state, the data line 420 is biased at ground by a reset driver 454, while the associated reference line 421 is driven to VDD through a reset driver 462, and both set driver 452 and set driver 464 remain off.

The data line 420 is coupled through one or more selection device 458, 460 to a bus line 456, which is then driven high or low by one of the two drivers 452, 454. In addition, the reference line 421 is coupled through one or more selection devices 468, 461 to a bus line 466, which is then driven high or low by one of the two drivers 462, 464. Also shown are devices 459, 469, which couple the data line and reference line, respectively, to a write standby voltage of, for example, ½ VDD conveyed on node 470.

In some preferred embodiments, the selection circuit closest to the data line and reference line (i.e., coupled directly to the data line and reference line) is a two-device decoder head circuit, such as that formed by devices 458, 459. As the exemplary circuit shows, both the pullup current and the pulldown current for the respective data states for both a data line and for a reference line are preferably conducted through the respective NMOS transistor of such a two-device driver. Such two-device driver heads are useful in multi-headed decoder arrangements. Exemplary multi-headed decoders, useful for both row and column decoder circuits, are set forth in: "Multi-Headed Decoder Structure Utilizing Memory Array Line Driver with Dual Purpose Driver Device" by Roy E. Scheuerlein and Matthew P. Crowley, U.S. Pat. No. 6,856,572, the disclosure of which is hereby incorporated by reference in its entirety; in "Tree Decoder Structure Particularly Well-Suited to Interfacing Array Lines Having Extremely Small Layout Pitch" by Roy E. Scheuerlein and Matthew P. Crowley, U.S. Pat. No. 6,859,410, the disclosure of which is hereby incorporated by reference in its entirety; in "Dual-Mode Decoder Circuit, Integrated Circuit Memory Array Incorporating Same, and Related Methods of Operation" by Kenneth K. So, Luca G. Fasoli and Roy E. Scheuerlein, U.S. application Ser. No. 11/026,493 filed on Dec. 30, 2004, which application is hereby incorporated by reference in its entirety; and in "Apparatus and Method for Hierarchical Decoding of Dense Memory Arrays Using Multiple Levels of Multiple-Headed Decoders" by Luca G. Fasoli, et al., U.S. application Ser. No. 11/026,470, filed Dec. 30, 2004, the disclosure of which is hereby incorporated by reference.

Unselected data lines in a multi-headed decoder arrangement are held at the read or write standby (i.e., inactive) voltage. This allows efficient array line driver layout in 2D and especially 3D array implementations with very tight array line pitches. Moreover, use of such driver circuits allows improved layout, as all such devices nearest the array in a simultaneously selected group of array lines can be the same type (e.g., NMOS). By use of only positive voltages, the layout of such driver circuits may be reduced in area since device wells need not contemplate bipolar voltages relative to ground. In some embodiments, various ones of the decoder outputs may be boosted above VDD, particularly such outputs as control selection devices 458 and 460.

Figure 12:
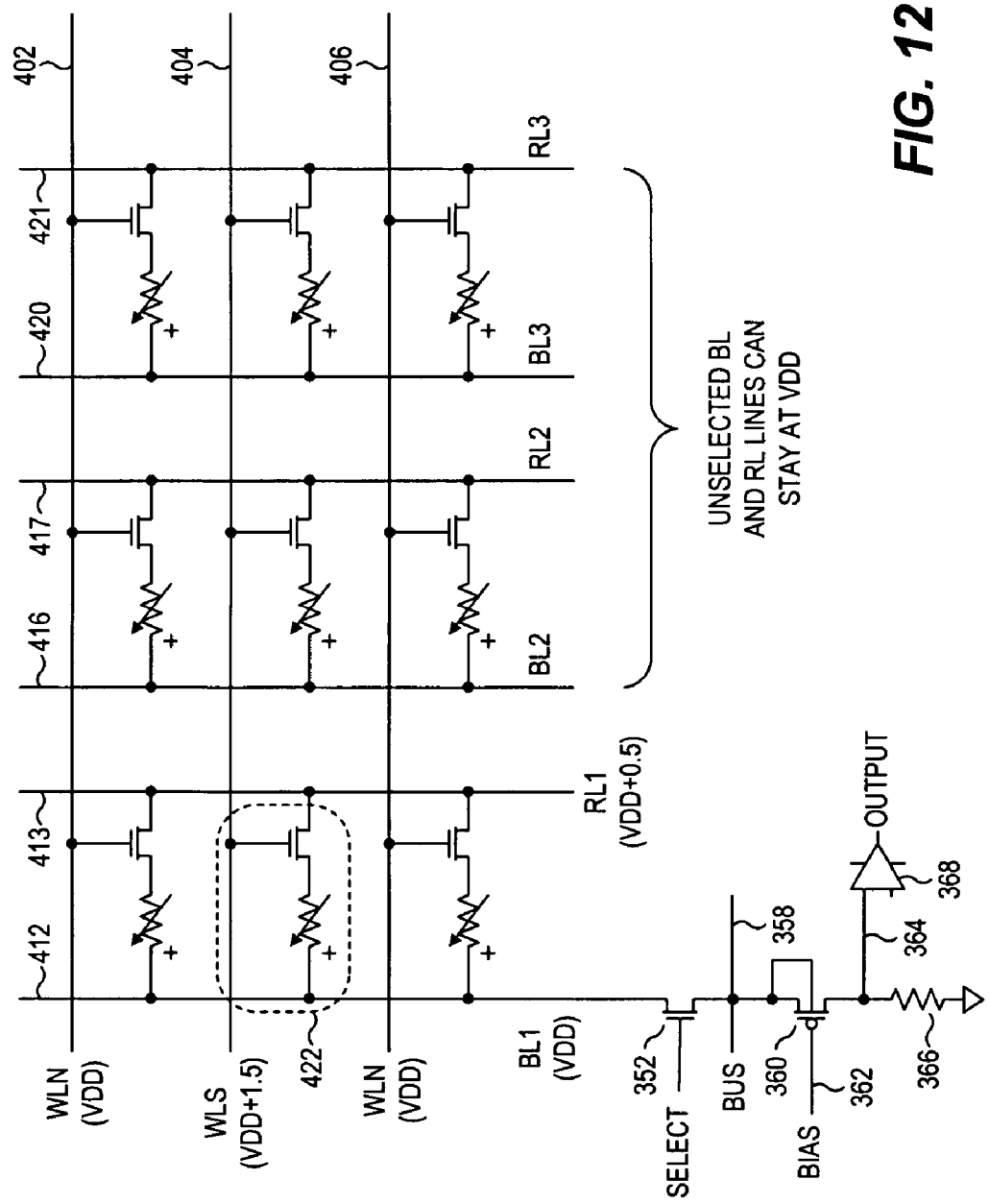
FIG. 12 is a schematic diagram of another exemplary read circuit consistent with some embodiments of the invention.

Several embodiments for reading a memory array having non-shared reference lines will be next described. Referring now to FIG. 12, a memory array 480 is shown which utilizes voltage-clamped data line sensing much like that shown in FIG. 7. The unselected array lines (i.e., unselected data lines, reference lines, and select lines) are biased at a read standby voltage equal to VDD. The unselected and half-selected memory cells contribute no power dissipation.

The selected reference line(s) is driven to a voltage above VDD (e.g., VDD+0.5 volts), which reverse biases the selected memory cell 422. The selected data line 412 is voltage clamped to VDD. Current flowing on the selected data line 412 through the selected memory cell 422 is sensed to determine whether the switchable resistor memory element within the selected memory cell 422 is in the set data state or the reset data state.

A select device 352 couples the selected data line 412 to a bus line 358. A clamp device 360 is biased with a BIAS signal 362 having a magnitude appropriate for maintaining the selected data line 412 at about VDD. Sensing node 364 proceeds as in the earlier embodiment. Likewise, the read bias conditions depicted provide for a fast read capability, as all non-selected array lines can stay at VDD without consuming power in the array.

There would be less signal if, within the memory cell, the resistor element is instead on the drain side of the switch because the source voltage would drop, decreasing the resistance of the switch, when sensing a high resistance state. But embodiments with resistor elements on the drain side are also envisioned, as long as the anode side of the resistor is still on the more negative side, i.e. still biased during read in the direction of a RESET operation.

Figure 13:
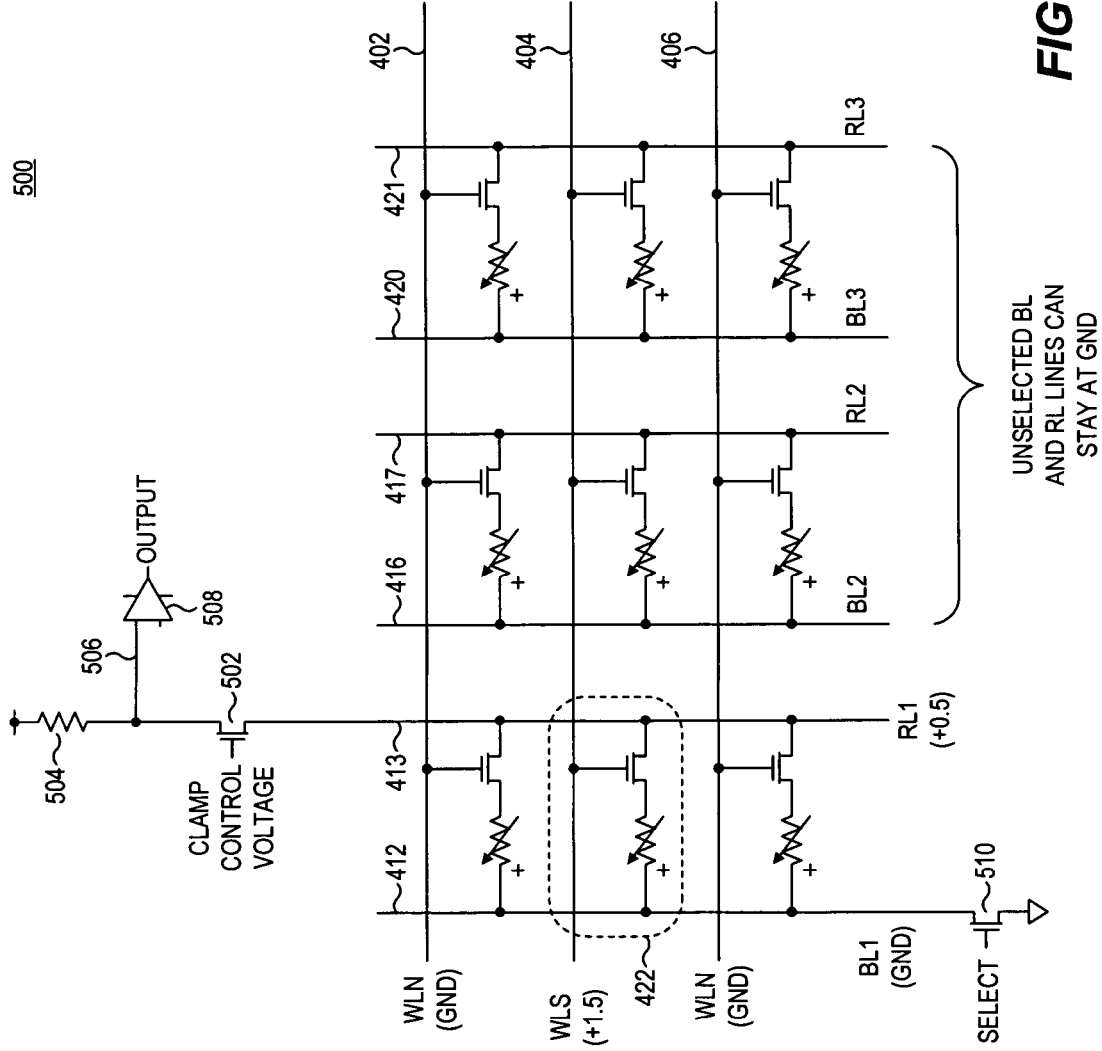
FIG. 13 is a schematic diagram of yet another exemplary read circuit consistent with some embodiments of the invention.

In cell arrangements that do not share reference lines between columns of memory cells, sensing can be done on the reference line. Referring now to FIG. 13, a memory array 500 is shown in which the selected reference line is voltage clamped to a positive read voltage (relative to the read standby voltage) and current sensed. Clamp control device 502 is biased at a level appropriate for maintaining a read voltage of about 0.5 volts on the selected reference line 413, and resistor 504 node 506 and amplifier 508 (which are analogous to resistor 366 and amplifier 368) generate an output signal reflective of the data state.

This arrangement still impresses a read voltage across the selected memory cell that reverse biases the switchable resistor memory element, and specifically that is opposite in polarity to the set voltage for the switchable resistor memory element. In addition, sensing the reference line as shown allows the read standby voltage to be ground rather than VDD. Advantageously, we can use an NMOS select device (e.g., 502) as a clamp device, which has a lower resistance than a PMOS device, and which helps keep the resistance modest relative to the memory cell resistance element. Note that such an arrangement may also be viewed alternatively as sensing a data line while holding the reference line at ground, with the relative position of the switchable resistor memory element and transistor switch device within the memory cell reversed to that shown. Such an embodiment is particularly appropriate in a vertical memory cell structure in which the reference lines are not shared. Consequently, in the claims that follow, no relative position of the resistor element and the switch device within a memory cell is to be presumed unless explicitly recited in the claim.

Figure 14:
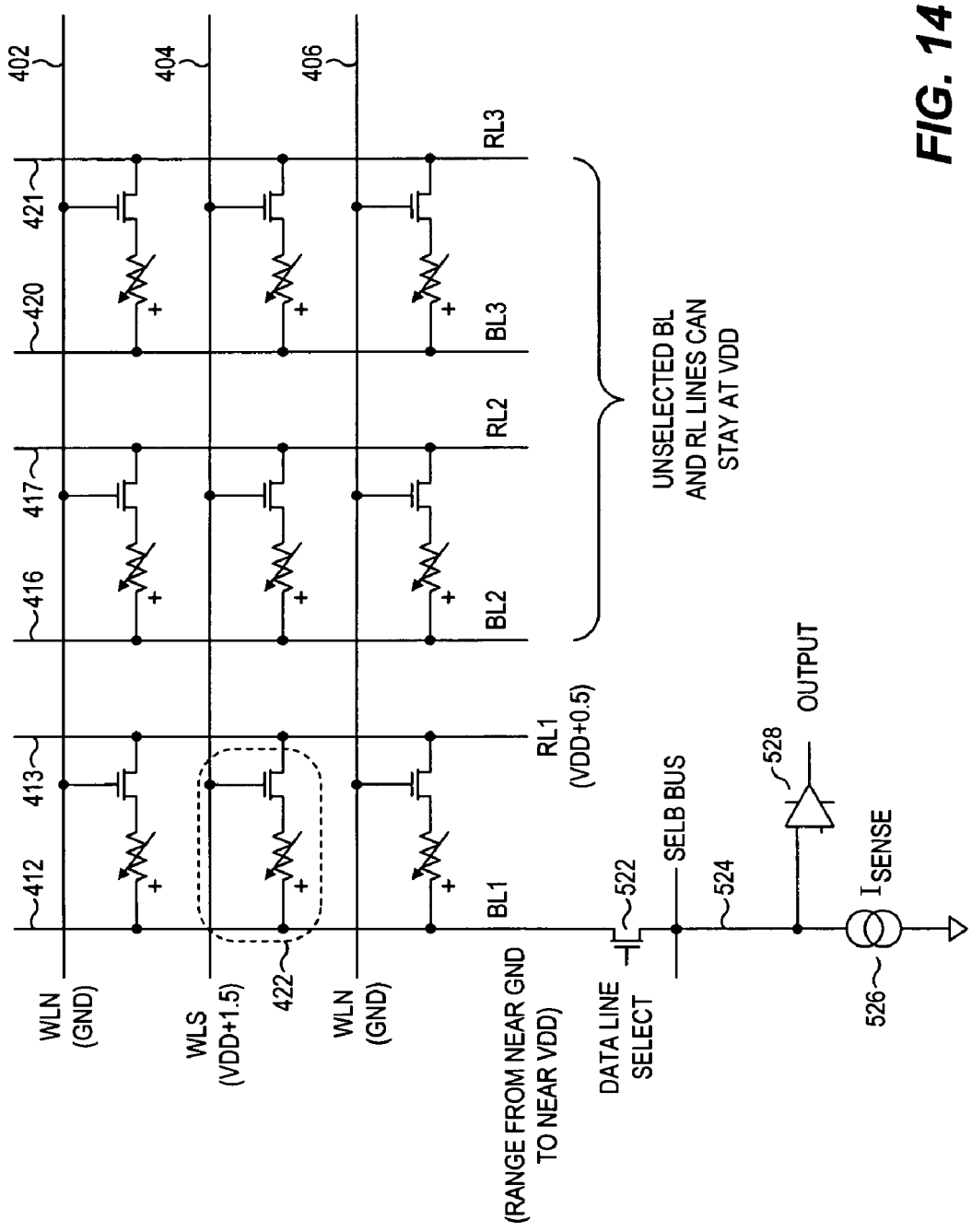
FIG. 14 is a schematic diagram of still another exemplary read circuit consistent with some embodiments of the invention.

Alternatively, we can sink current from the selected data line that is less than the critical point for disturbing the low resistance state, and detect voltage. Referring now to FIG. 14, an array 520 is shown which utilizes voltage sensing rather than current sensing. This eliminates the data line clamp circuit, but may be slower if there is significant capacitance on the data lines. Note that the $V_{GS}$ of the switch device within the selected memory cell 422 is about the same for both reading a "1" and reading a "0" because the TFT source voltage of the device is just the $V_{DS}$ of the TFT switch device (at a known magnitude of current, as determined by the "$I_{SENSE}$" current source circuit 526) below the reference line voltage. Thus, the voltage signal developed on the data line (which may range from approximately VDD to almost ground) is determined by the sense current passing through either the high-resistance or low-resistance value of the switchable resistor memory element. In other words, the difference in voltage for the two data states is determined by the sense current times the difference in the high-state and low-state values of resistance. However, there would be less signal if the resistor element is on the drain side of the switch (i.e., closest to the reference line rather than to the data line) because the source voltage of the TFT switch device would drop, decreasing the resistance of the switch, when we are sensing a high resistance state. Consequently, the resistance of the TFT would not remain essentially constant, and would offset some of the high resistance state, and generate less total signal. An exemplary data line select device 522 is shown coupling the selected data line to a bus line 524, which is shown as an input of amplifier 528, although any number of various selection configurations may alternatively be used, including those having additional levels of selection and/or decoding.

Figure 15:
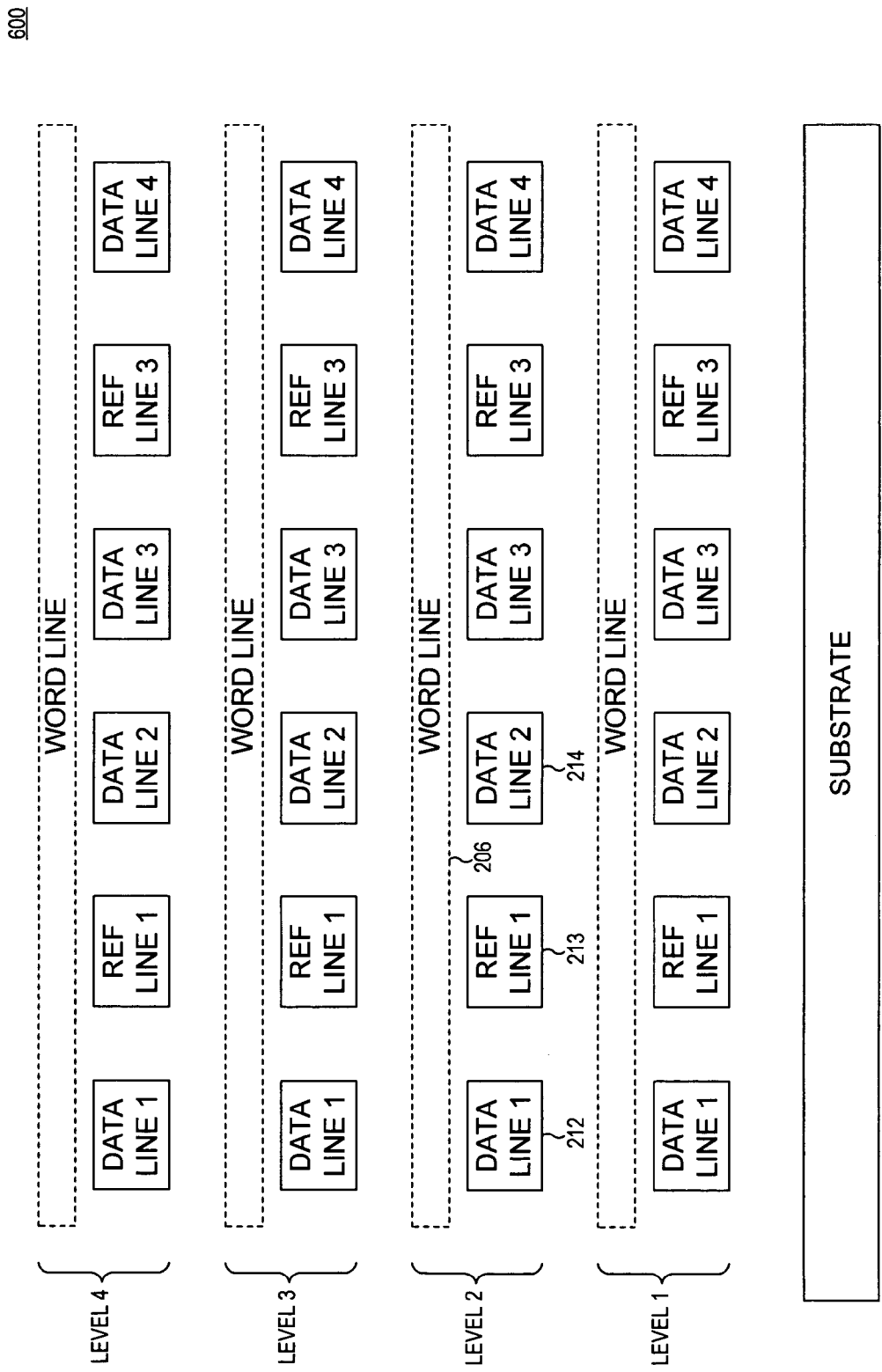
FIG. 15 is a cross-sectional diagram of a three-dimensional memory array consistent with some embodiments of the invention.

Referring now to FIG. 15, a cross-sectional view is shown representing array lines of a three-dimensional memory array 600. Four memory levels are depicted, with each level including multiple line sets of coplanar array lines (two line sets of which are shown perpendicular to the plane of the page). In this example, each line set includes a pair of data lines (in this embodiment also described as bit lines) and a shared reference line disposed between and adjacent to the data lines. Each memory level also includes a plurality of select lines (in this embodiment also described as word lines), one of which is shown traversing from left to right on the page. For clarity, four of the array lines are labeled consistent with the embodiment shown in FIG. 2.

In various embodiments, one or more memory cells may be written and/or read (i.e., accessed) at the same time. Obviously, if one memory cell is accessed, then only one select line, only one data line, and only one reference line is involved. However, if more than one memory cell is accessed, more than one data line is involved by necessity, and possibly more than one word line and more than one reference line.

For example, four memory cells may be accessed on a single memory level, all four associated with the same word line. In the embodiment shown, all four depicted data lines and both reference lines would be involved (assuming that the selected line sets are adjacent, although such is not required). Alternatively, four memory cells may be accessed with two cells disposed on each of two memory levels. Preferably this would be accomplished by selecting a respective line set on each level, but other configurations are contemplated. For example, a line set could be selected, and only one of the two data lines actually biased at a different level than the reference line, leaving the other data line essentially unselected. Thus, two different line sets on each of two memory levels could be selected to access four memory cells. If, alternatively, each line set included only a single data line (e.g., FIG. 9), then such a configuration would be a preferred configuration.

In some embodiments a group of adjacent data lines is simultaneously selected on each of a group of adjacent memory levels to simultaneously access a plurality of memory cells. For example, sixteen memory cells may be accessed by selecting all sixteen data lines shown in the figure, all eight reference lines shown, and all four word lines shown. Decoding and/or selection circuitry may be more easily accomplished when simultaneously selected data lines are adjacent, both horizontally and vertically. Nevertheless, numerous variations of simultaneous access of more than one memory cell are suggested by the above description, and are specifically contemplated.

In the above embodiments, each memory cell is assumed to have either a low-resistance state or a high-resistance state, thereby providing for a single data bit stored in each memory cell. However, since the value of the low-resistance state may be controlled by limiting the magnitude of the set current that is allowed to flow through a memory cell when programmed to the "set" state, in some embodiments a memory cell may be programmed to one of several "set" states.

Figure 16:
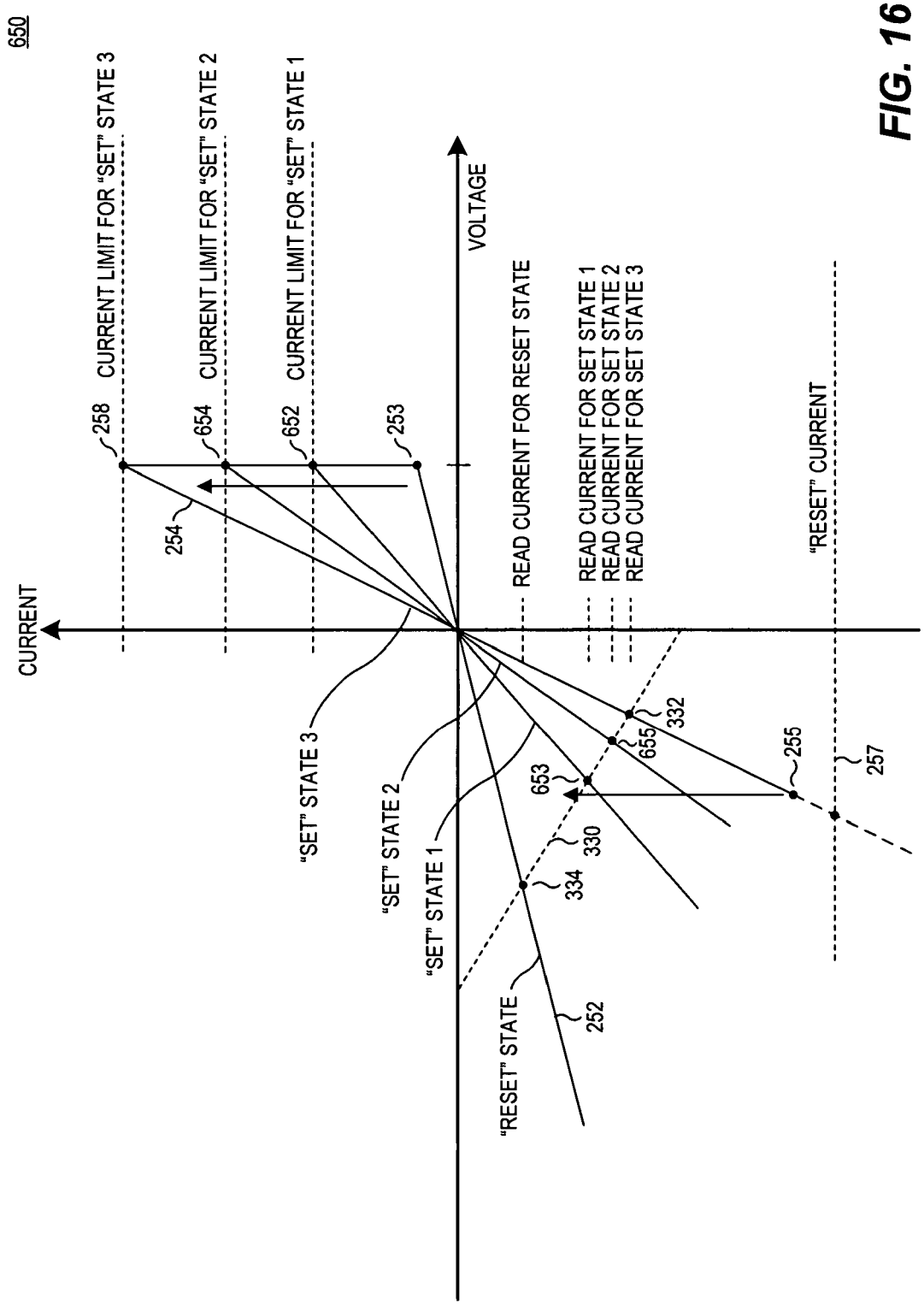
FIG. 16 is a diagram of the current-voltage relationship of an exemplary switch able resistor memory element depicting multiple set currents consistent with some embodiments of the present invention.

Referring now to FIG. 16, an I-V curve illustrates such operation with more than one set state. The critical "set" voltage (labeled 253) remains as before, and when reached, causes the switchable resistor memory element to change from the high resistance state 252 to a lower-resistance state. If the set current is limited to that shown as STATE 1, then the actual resistance of the low-resistance state 1 will be set to the point labeled 652 (and the associated SET STATE 1 resistive line through the origin). Similarly, a set current for STATE 2 results in a resistance corresponding to point 654, and a set current for STATE 3 results in a resistance corresponding to point 258.

Such a cell is preferably read with reverse bias. A linear TFT load line 330 is shown in the lower-left quadrant of the I-V curve, corresponding to a negative voltage being impressed across a selected memory cell. The resistance and therefore the slope of the switch device load line 330 preferably is comparable to the lowest resistance state (load line 254) so as not to dilute the signal available from the cell. The current sensed is indicated by the intersection points with the three SET state lines (labeled 653, 655, 332) and RESET state line (labeled 334). Each of these bias points 334, 653, 655, 332 corresponds respectively to the amount of read current in Set State 1, Set State 2, Set State 3, and the Reset State.

The reset current should be at least as large as the highest set current limit. To set a memory cell to one of the intermediate values, the cell may be reset to the highest-resistance state, and then set to the appropriate one of the set states. Such a reset operation may be carried out on an entire block of memory cells (e.g., a page of data at a time) before any memory cells are programmed to one of the set states. Such a block reset may be implemented internally as sequential reset operations, each for resetting one or more memory cells, using as many of such internal reset operations as is required to "erase" the entire block, even if such a block erase is initiated by a single command and appears to execute as a single operation. Such operation would provide for compatibility with page oriented memory integrated circuits having erase operations embodied in on-chip control logic, similar to commercially available NAND flash memory devices.

Alternatively, a memory cell could be set from one set state to a "higher" set state without such an initial "erase" operation (e.g., by first reading the memory cell to determine its current state before programming), but this would be data dependent.

A memory cell in a large array may be disturbed when voltage is applied to neighboring cells, for example to a cell on a shared conductor. In arrays such as that taught in, for example, Herner et al., U.S. patent application Ser. No. 11/125,939, "Rewriteable Memory Cell Comprising a Diode and a Resistance-Switching Material," filed May 9, 2005, hereby incorporated by reference, a resistance-switching material is paired with a diode to provide electrical isolation. A diode is not the most advantageous choice of use with materials such as those described herein. The resistance-switching materials of the present invention utilize bi-directional voltage and current, while a diode is generally a one-way device. In addition, the relatively low switching voltages of many of the resistance-switching materials contemplated for use in the present invention are difficult to achieve given the relatively high turn-on voltages associated with most conventional diodes, assuming a reasonably low power supply voltage.

Another monolithic three dimensional memory array comprising transistors and resistance-switching memory elements is described in Petti, U.S. patent application Ser. No. 11/143,269, entitled "Rewriteable Memory Cell Comprising a Transistor and Resistance-Switching Material in Series," filed Jun. 2, 2005, owned by the assignee of the present invention, and hereby incorporated by reference. The resistance switching materials described therein are both set and reset with the same polarity of voltage. A risk of read disturb arises from the very low reset voltage that changes the low-resistance state to the high-resistance state. Such memory cells are likewise advantageously read with a read voltage that is opposite in polarity than the set voltage. In this case, the read voltage is opposite in polarity to both the set and reset voltages.

As used herein, a current source (i.e., also "constant current" source) may be viewed as a circuit providing generally a constant current irrespective of the voltage impressed across the device. Examples include a current mirror circuit. In many such practical constant current circuits, the magnitude of the "constant" current may diminish as the voltage across the circuit is reduced. A "current limiting circuit" may also be thought of as such a constant current source, although the "current limiting" terminology acknowledges that the constant current may decrease for some bias voltages thereacross, but the current therethrough is nonetheless limited to a maximum magnitude for all such biases.

As used herein, a node which is "biased to a voltage higher than X" may mean that the node is coupled to a voltage source through a constant current or current limiting circuit, such that the voltage developed on the biased node is indeed higher than X, but not necessarily of a predictable or fixed voltage value. As used herein, "coupling a node to a voltage" may include one or more intervening devices, such that the node may not necessarily reach the voltage. For example, a node may be coupled to a first voltage through a current limiting circuit, and possibly through one or more selection devices.

As used herein the SET state is assumed to be a low-resistance state, while the RESET state is assumed to be a high-resistance state. The SET action is for programming the memory cell resistor to the SET state; likewise for RESET action is for programming the memory cell resistor to the SET state. The SET threshold is in a forward direction, and RESET threshold in a reverse direction.

In some embodiments, the memory cells may be formed entirely in a semiconductor substrate. In other embodiments, including many of those described above, the memory cells are formed entirely in layers formed above such a substrate, including non-semiconductor substrates. Many specific forms of a switchable resistor memory element are contemplated, including those set forth in the aforementioned Scheuerlein I and Scheuerlein II applications previously incorporated.

In some embodiments, a non-shared reference line may be biased at an intermediate voltage, such as ½ VDD, and the associated data line driven above or below the voltage of said reference line (similar to that shown in FIG. 4).

The phrases "programming a memory cell to a set state" and "programming the switchable resistor memory element within a memory cell to a set state" and "programming a memory cell to a low-resistance state" and "programming the switchable resistor memory element within a memory cell to a low-resistance state" may be used interchangeably herein, and no subtle distinctions should be inferred from such use.

In most preferred embodiments, memory array support is formed in the substrate beneath the memory, and electrical connections must be made from the ends of the data lines, reference lines, and select lines of the array to this circuitry. An advantageous scheme for making these connections while minimizing use of substrate area is described in Scheuerlein et al., U.S. Pat. No. 6,879,505, "Word Line Arrangement Having Multi-Layer Word Line Segments for Three-Dimensional Memory Array," owned by the assignee of the present invention and hereby incorporated by reference. Moreover, in certain embodiments, such support circuitry may include select line decoders and data line decoders arranged in a checkerboard fashion beneath a three-dimensional memory array formed above a substrate. Additional information regarding exemplary checkerboard arrangements may be found in U.S. Pat. No. 6,735,104, issued May 11, 2004, which is hereby incorporated by reference in its entirety.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

As used herein, a "global array line" (e.g., a global bit line) is an array line that connects to array line segments in more than one memory block, but no particular inference should be drawn suggesting such a global array line must traverse across an entire memory array or substantially across an entire integrated circuit.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing description has described only a few of the many possible implementations of the present invention. For this reason, this detailed description is intended by way of illustration, and not by way of limitation. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A method for reading a memory cell of a nonvolatile memory array, each memory cell having a switchable resistor memory element in series with a thin film transistor switch device, said switchable resistor memory element decreasing in resistance when a set voltage is applied thereacross, said method comprising:
   impressing a read voltage across a selected memory cell, said read voltage and said set voltage being opposite in polarity; and
   detecting whether the switchable resistor memory element within the selected memory cell has a low resistance state or a high resistance state.

2. The method as recited in claim 1 wherein:
said switchable resistor memory element increases in resistance when a reset voltage is applied thereacross, wherein the set voltage and the reset voltage are opposite in polarity.

3. The method as recited in claim 1 wherein:
the memory array comprises a monolithic three-dimensional memory array formed above a substrate.

4. The method as recited in claim 1 wherein:
the magnitude of the set voltage is less than about 2.0 volts.

5. The method as recited in claim 1 wherein:
said switchable resistor memory element increases in resistance when a reset voltage is applied thereacross;
the set voltage and the reset voltage are the same polarity; and
the reset voltage is less than the set voltage.

6. The method as recited in claim 1 wherein:
the magnitude of the read voltage is greater than the magnitude of the set voltage.

7. The method as recited in claim 6 wherein:
the magnitude of the read voltage is at least about 0.5 volts.

8. The method as recited in claim 1 wherein each memory cell is coupled between an associated data line and an associated reference line parallel to the associated data line, and wherein the respective switch device for each memory cell is controlled by an associated select line, said method further comprising:
   biasing a first data line and a parallel first reference line both associated with a first memory cell to impart said read voltage across the first memory cell, a read disturb portion of said read voltage appearing across the switchable resistor memory element within the first memory cell, said read disturb voltage having opposite polarity relative to a set voltage applied across the switchable resistor memory element during programming to change the switchable resistor memory element from a high-resistance state to a low-resistance state;
   applying a voltage to a first select line associated with the first memory cell sufficient to turn on the switch device within the first memory cell; and
   sensing a voltage or current developed on one of the first data line and first reference line in accordance with the resistance of the switchable resistor memory element within the first memory cell.

9. The method as recited in claim 8 wherein:
said set voltage is opposite in polarity relative to a reset voltage applied across the first memory cell during programming to change the switchable resistor memory element from a low-resistance state to a high-resistance state.

10. The method as recited in claim 8 wherein the magnitude of the read voltage is greater than the magnitude of the set voltage.

11. The method as recited in claim 10 wherein the voltage applied to the first select line is lower than a voltage applied thereto when programming the first memory cell.

12. The method as recited in claim 8 further comprising:
   biasing unselected data lines, unselected reference lines, and unselected switch device select lines at a read standby voltage;
   biasing one of the first data line and first reference line to a voltage above or below the read standby voltage by the magnitude of the read voltage; and
   biasing the first select line to an offset voltage relative to the read standby voltage.

13. The method as recited in claim 12 further comprising:
   biasing the first reference line to a voltage above the read standby voltage by the magnitude of the read voltage, to thereby develop the read voltage across the first memory cell.

14. The method as recited in claim 13 further comprising:
   clamping the first data line at about the read standby voltage; and
   sensing current flow on the first data line.

15. The method as recited in claim 13 further comprising:
clamping the first reference line voltage; and
sensing current flow on the first reference line.

16. The method as recited in claim 13 further comprising:
coupling a reference current to the first data line; and
sensing a voltage developed on the first data line.

17. The method as recited in claim 12 wherein the read standby voltage comprises a first power supply voltage.

18. The method as recited in claim 17 wherein the magnitude of the read voltage is greater than the magnitude of the set voltage.

19. The method as recited in claim 18 wherein the magnitude of the read voltage is at least 0.5 volts.

20. The method as recited in claim 12 wherein the offset voltage is at least +1.5 volts.

21. The method as recited in claim 12 wherein the read standby voltage comprises a ground reference voltage.

22. The method as recited in claim 21 further comprising:
clamping the first reference line voltage at a voltage substantially equal to the magnitude of the read voltage above the ground reference voltage; and
sensing current flow on the first reference line.

23. The method as recited in claim 8 wherein the first reference line is shared by the first data line and a second data line, and a second memory cell is associated with the second data line, the first reference line, and the first select line.

24. The method as recited in claim 23 further comprising:
biasing one of the second data line and first reference line to a voltage above or below the read standby voltage by the magnitude of the read voltage;
sensing a voltage or current developed on the first data line in accordance with the resistance of the switchable resistor memory element within the first memory cell; and
sensing a voltage or current developed on the second data line in accordance with the resistance of the switchable resistor memory element within the second memory cell.

25. The method as recited in claim 24 wherein:
the memory array comprises a monolithic memory array having at least two memory levels formed above a substrate; and
each memory level includes a plurality of line sets, each respective line set including a respective reference line associated with a respective pair of data lines.

26. The method as recited in claim 8 wherein:
the memory array comprises a hierarchical data line architecture having global bit lines each associated with a respective plurality of local bit lines; and
each aforementioned data line comprises a local bit line.

27. The method as recited in claim 8 further comprising:
biasing a second data line and a parallel reference line both associated with a second memory cell to impart the read voltage across the second memory cell;
applying the select voltage to a select line associated with the second memory cell sufficient to turn on the switch device within the second memory cell; and
sensing a voltage or current developed on one of the second data line and the reference line associated with the second memory cell in accordance with the resistance of the switchable resistor memory element within the second memory cell;
wherein the second memory cell sensing is simultaneous with the first memory cell sensing.

28. The method as recited in claim 27 wherein:
the memory array comprises a monolithic memory array having at least two memory levels formed above a substrate; and
the first and second memory cells reside on separate levels of the memory array.

29. The method as recited in claim 27 wherein:
the reference line associated with the second memory cell is distinct from the first reference line.

30. The method as recited in claim 29 wherein:
the memory array comprises a monolithic memory array having at least two memory levels formed above a substrate; and
each memory level includes a plurality of line sets, each respective line set including a respective reference line associated with a single respective data line.

31. The method as recited in claim 30 wherein:
the first and second memory cells reside on separate levels of the memory array.

32. The method as recited in claim 30 wherein:
the first and second memory cells reside on the same level of the memory array.

33. The method as recited in claim 27 wherein:
the reference line associated with the second memory cell is the same line as the first reference line.

34. The method as recited in claim 33 wherein:
the memory array comprises a monolithic memory array having at least two memory levels formed above a substrate; and
each memory level includes a plurality of line sets, each respective line set including a respective reference line associated with a respective pair of data lines.

35. The method as recited in claim 8 wherein:
the memory array is formed above a substrate; and
the respective switch device within each memory cell comprises a thin film transistor (TFT).

36. The method as recited in claim 35 wherein each TFT switch device comprises silicon, germanium, or an alloy of silicon or germanium.

37. The method as recited in claim 35 wherein within each memory cell, the resistance of the TFT switch device when turned on is greater than the resistance of the low resistance state of the switchable resistor memory element.

38. A method for reading a memory cell of a nonvolatile memory array, each memory cell having a switchable resistor memory element in series with a transistor switch device, said switchable resistor memory element decreasing in resistance when a set voltage is applied thereacross, said method comprising:
impressing a read voltage across a selected memory cell, said read voltage and said set voltage being opposite in polarity; and
detecting, from a group of at least three programmable resistance states, the resistance state of the switchable resistor memory element within the selected memory cell.

39. The method as recited in claim 38 wherein the three programmable resistance states comprise a reset state and two different set states.

40. The method as recited in claim 38 wherein the memory array comprises a monolithic memory array having at least two memory levels formed above a substrate.

41. The method as recited in claim 38 wherein the transistor switch device within each memory cell comprises a thin film transistor.

42. The method as recited in claim 38 wherein:
each memory cell is coupled between an associated data line and an associated reference line parallel to the associated data line.

43. An integrated circuit comprising:
an array of non-volatile memory cells, each memory cell having a switchable resistor memory element in series with a thin film transistor, said switchable resistor memory element decreasing in resistance when a set voltage is applied thereacross;
circuitry for impressing the set voltage across the switchable resistor memory element of a selected memory cell during a programming operation, and for impressing a read voltage across the selected memory cell during a read operation, said read voltage and said set voltage being opposite in polarity; and
circuitry for detecting, from a group of at least two programmable resistance states, the resistance state of the switchable resistor memory element within the selected memory cell.

44. The integrated circuit as recited in claim 43 wherein the memory array comprises a monolithic memory array having at least two memory levels formed above a substrate.

45. The integrated circuit as recited in claim 43 wherein said group of at least two programmable resistance states comprises a reset state and two different set states.

46. The integrated circuit as recited in claim 43 wherein:
each memory cell is coupled between an associated data line and an associated reference line parallel to the associated data line.

* * * * *

UNITED STATES PATENT AND TRADEMARK OFFICE
CERTIFICATE OF CORRECTION

PATENT NO. : 7,345,907 B2
APPLICATION NO. : 11/179123
DATED : March 18, 2008
INVENTOR(S) : Roy E. Scheuerlein It is certified that error appears in the above-identified patent and that said Letters Patent is hereby corrected as shown below:

Title Page, Col. 2, Abstract, line 1, please replace "switch able" with -- switchable --
           line 6, please replace "scaleable" with -- scalable --
           line 10, please replace "switch able" with -- switchable --
Col. 1, line 14, please replace "Switch able" with -- Switchable --
Col. 1, line 24, please replace "Switch able" with -- Switchable --
Col. 1, line 32, please replace "switch able" with -- switchable --
Col. 1, line 56, please replace "switch able" with -- switchable --
Col. 1, line 60, please replace "switch able" with -- switchable --
Col. 1, line 67, please replace "switch able" with -- switchable --
Col. 2, line 1, please replace "switch able" with -- switchable --
Col. 2, line 6, please replace "switch able" with -- switchable --
Col. 2, line 11, please replace "switch able" with -- switchable --
Col. 2, line 19, please replace "switch able" with -- switchable --
Col. 2, line 21, please replace "switch able" with -- switchable --
Col. 2, line 23, please replace "switch able" with -- switchable --
Col. 2, line 29, please replace "switch able" with -- switchable --
Col. 2, line 33, please replace "switch able" with -- switchable --
Col. 2, line 34, please replace "switch able" with -- switchable --
Col. 2, line 41, please replace "switch able" with -- switchable --
Col. 2, line 45, please replace "switch able" with -- switchable --
Col. 2, line 47, please replace "switch able" with -- switchable --
Col. 2, line 49, please replace "switch able" with -- switchable --
Col. 2, line 56, please replace "switch able" with -- switchable --
Col. 3, line 12, please replace "switch able" with -- switchable --
Col. 3, line 16, please replace "switch able" with -- switchable --
Col. 3, line 19, please replace "switch able" with -- switchable --
Col. 3, line 46, please replace "switch able" with -- switchable --
Col. 3, line 64, please replace "switch able" with -- switchable --
Col. 4, line 16, please replace "Group IV A" with -- Group IVA --
Col. 4, line 19, please replace "thereof" with -- thereof. --
Col. 4, line 21, please replace "Co.," with -- Co, --
Col. 4, line 45, please replace "switch able" with -- switchable --
Col. 4, line 66-67, please replace "Switch able" with -- Switchable --
Col. 5, line 4, please replace "switch able" with -- switchable --
Col. 5, line 13, please replace "switch able" with -- switchable --
Col. 7, line 63, please replace "selected" with -- select --
Col. 10, line 23, please replace "con occur" with -- can occur --
Col. 10, line 33, please replace "above the" with -- above the current --
Col. 10, line 36, please replace "disturb" with -- disturbed --

UNITED STATES PATENT AND TRADEMARK OFFICE
CERTIFICATE OF CORRECTION

PATENT NO. : 7,345,907 B2
APPLICATION NO. : 11/179123
DATED : March 18, 2008
INVENTOR(S) : Roy E. Scheuerlein It is certified that error appears in the above-identified patent and that said Letters Patent is hereby corrected as shown below:

(Continued)
Col. 18, line 11, please replace "504 node 506 and" with -- 504, node 506, and --

Signed and Sealed this

Twenty-eighth Day of October, 2008

JON W. DUDAS
*Director of the United States Patent and Trademark Office*